(12) United States Patent
Nakatani et al.

(10) Patent No.: US 6,940,707 B2
(45) Date of Patent: Sep. 6, 2005

(54) DIFFERENTIAL CAPACITOR, DIFFERENTIAL ANTENNA ELEMENT, AND DIFFERENTIAL RESONATOR

(75) Inventors: Toshifumi Nakatani, Sakai (JP); Hisashi Adachi, Mino (JP); Kayo Nakanishi, Otokuni-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 10/880,531

(22) Filed: Jul. 1, 2004

(65) Prior Publication Data

US 2005/0002149 A1 Jan. 6, 2005

(30) Foreign Application Priority Data

Jul. 3, 2003 (JP) .......................................... 2003-191267

(51) Int. Cl.[7] .............................................. H01G 4/005
(52) U.S. Cl. ....................... 361/303; 361/329; 361/277; 361/309
(58) Field of Search ............................. 361/303, 306.1, 361/306.3, 308.1, 309, 310, 328–329, 330

(56) References Cited

U.S. PATENT DOCUMENTS

| | | |
|---|---|---|
| 5,220,483 A | 6/1993 | Scott |
| 6,366,443 B1 * | 4/2002 | Devoe et al. ............... 361/313 |
| 6,456,481 B1 * | 9/2002 | Stevenson .................... 361/302 |
| 2002/0171115 A1 | 11/2002 | Nakatani |
| 2003/0201846 A1 | 10/2003 | Nakamura et al. |

FOREIGN PATENT DOCUMENTS

| | | |
|---|---|---|
| JP | 2980142 | 9/1999 |
| JP | 2003-037180 | 2/2003 |
| JP | 2003-338724 | 11/2003 |

OTHER PUBLICATIONS

Kin–Lu Wong and Tzung–Wern Chiou: "Broad–Band Dual–Polarized Patch Antennas Fed by Capacitively Coupled Feed and Slot–Coupled Feed", IEEE Transactions on Antennas and Propagation, vol. 50, No. 3, Mar. 2002, pp. 346–351.

* cited by examiner

*Primary Examiner*—Anthony Dinkins
(74) *Attorney, Agent, or Firm*—Wenderoth, Lind & Ponack, L.L.P.

(57) ABSTRACT

In a differential capacitor1, first and second capacitors 1003 and 1004 are formed in substantially symmetrical positions from each other with respect to a vertical plane B–B', on a semiconductor substrate 1020. The differential capacitor 1 further includes a shield plate 1022 interposed between the semiconductor substrate 1020 and the lower electrodes 1016 and 1018. When each of the lower electrodes 1016 and 1018 is projected onto the shield plate 1022 along the vertical direction, each projected lower electrode 1016 or 1018 has a partial overlap with the shield plate 1022.

37 Claims, 17 Drawing Sheets

VIRTUAL
GROUND

DIFFERENTIAL CAPACITOR, DIFFERENTIAL ANTENNA ELEMENT, AND DIFFERENTIAL RESONATOR

BACKGROUND OF THE INVENTION

1. Field of the Invention

The present invention relates to a differential capacitor, a differential antenna element, and a differential resonator. More particularly, the present invention relates to a differential capacitor, a differential antenna element, and a differential resonator formed on a semiconductor substrate.

2. Description of the Background Art

In recent years, more miniaturized and higher-frequency oriented semiconductor processes have been proposed, as a result of which it has become commonplace to integrate a differential oscillation circuit on a semiconductor. FIG. 17 is a schematic diagram illustrating the structure of a commonly-used differential oscillation circuit 7. In FIG. 17, the differential oscillation circuit 7 comprises: first and second transistors 1001 and 1002 for enabling oscillation; first and second capacitors 1003 and 1004 for composing a differential capacitor and cutting off a DC component; first and second variable capacitors 1005 and 1006 for enabling resonance; first and second inductances 1007 and 1008 for enabling resonance; and a constant current source 1009.

Via a Vcc terminal, a DC current is supplied to the first and second inductances 1007 and 1008 of the differential oscillation circuit 7. The DC current is supplied to the first and second transistors 1001 and 1002, and thereafter flows to ground via the constant current source 1009. The first transistor 1001 is connected so as to realize positive feedback, and generates either one of an in-phase signal or a reverse-phase signal composing a differential pair of signals, having an oscillation frequency which depends on circuit constants of the first variable capacitor 1005 and the first inductance 1007. The second transistor 1002, which operates similarly to the first transistor 1001, generates the other one of the in-phase signal or the reverse-phase signal. The generated in-phase signal and reverse-phase signal are output from the Vo+terminal and the Vo−terminal, respectively, or vice versa.

However, in the above-described differential oscillation circuit 7, the influence of a parasitic capacitance Cpa and a parasitic resistance Rpa (shown as dot-line images in FIG. 17) associated with the first capacitor 1003 increases as the oscillation frequency is increased. As a result, the sharpness of the resonance caused by the first variable capacitor 1005 and the first inductance 1007 is deteriorated; that is, a quality factor (which serves as an index of resonance sharpness) is deteriorated. The sharpness of the resonance caused by the second variable capacitor 1006 and the second inductance 1008 also suffers a similar deterioration.

FIG. 18A is an upper plan view illustrating the structure of a differential capacitor (the first capacitor 1003 and the second capacitor 1004) which is integrated on a semiconductor substrate. FIG. 18B is a cross-sectional view showing the first capacitor 1003 and the second capacitor 1004, taken along a vertical plane A–A' shown in FIG. 18A. In FIGS. 18A and 18B, the first capacitor 1003 and the second capacitor 1004 are to be formed within an interlayer film 1019 on a semiconductor substrate 1020, which is typically composed of p-type silicon. The interlayer film 1019 is typically composed of silicon oxide. More specifically, the first capacitor 1003 includes an upper electrode 1015 and a lower electrode 1016, composed of metal wires which are typically aluminum. The upper electrode 1015 and the lower electrode 1016 are disposed parallel to each other, with a predetermined interval along the vertical direction. The second capacitor 1004 is composed of the same material as the first capacitor 1003, and includes an upper electrode 1017 and a lower electrode 1018, which are formed in symmetrical positions from the upper electrode 1015 and the lower electrode 1016, respectively, with respect to the predetermined vertical plane B–B'.

The first capacitor 1003 and the second capacitor 1004 suffer from the aforementioned parasitic capacitances, which occur in the interlayer film 1019 between the semiconductor substrate 1020 and the lower electrodes 1016 and 1018, respectively. Furthermore, the aforementioned parasitic resistances also occur in the semiconductor substrate 1020. Among these parasitic components, the parasitic resistances occurring in the semiconductor substrate 1020 affect the quality factors of the resonator circuits in particular.

In order to suppress such parasitic resistances, a differential capacitor (hereinafter referred to as the "conventional differential capacitor") as follows has been proposed. FIG. 19A is an upper plan view schematically showing the structure of the conventional differential capacitor. FIG. 19B is a cross-sectional view showing the first capacitor 1003 and the second capacitor 1004, taken along a vertical plane A–A' shown in FIG. 19A. The conventional differential capacitor shown in FIGS. 19A and 19B differs from that shown in FIGS. 18A and 18B in that a shield plate 1021 is additionally comprised. Otherwise, the two differential capacitors are identical. Therefore, in FIGS. 19A and 19B, those component elements which have their counterparts in FIGS. 18A and 18B are denoted by the same reference numerals as those used therein, and the descriptions thereof are omitted.

The shield plate 1021, which is a plate-like structural component composed of a conductive material such as aluminum, is disposed between the semiconductor substrate 1020 and the lower electrodes 1016 and 1018. More specifically, the shield plate 1021 has a shape such that, when the lower electrodes 1016 and 1018 are projected onto the shield plate 1021 from vertically above, the projected lower electrodes 1016 and 1018 appear as being contained within the outer contour of the shield plate 1021. The shield plate 1021 has a symmetrical shape with respect to the aforementioned vertical plane B–B'. With the shield plate 1021 as such, the parasitic capacitances in the interlayer film 1019 are increased, but the parasitic resistances in the semiconductor substrate 1020 are reduced.

By applying the conventional differential capacitor structure to the differential oscillation circuit 7 as shown in FIG. 17, the sharpness of the resonance caused by each resonator circuit can be improved. Specifically, as shown by an equivalent circuit of FIG. 20, the following parasitic components will appear in the differential oscillation circuit 7: a parasitic capacitance Cpa1 between the lower electrode 1016 and the shield plate 1021, a parasitic capacitance Cpa2 between the lower electrode 1018 and the shield plate 1021, a parasitic capacitance Cpc between the shield plate 1021 and the semiconductor substrate 1020, and a parasitic resistance Rpc in the semiconductor substrate 1020. Since an in-phase signal and a reverse-phase signal are applied to the first capacitor 1003 and the second capacitor 1004 (or vice versa), a junction between the parasitic capacitances Cpa1 and Cpa2 serves as an apparent ground (hereinafter referred to as "virtual ground") with respect to an AC signal. As a result, the influences of the parasitic capacitance Cpc and the parasitic resistance Rpc on the resonator circuits can be reduced.

However, if the conventional differential capacitor structure were to be applied to the differential oscillation circuit 7, the parasitic capacitances Cpa1 and Cpa2 (see FIG. 20) would in effect be in parallel connection with the first variable capacitor 1005 and the second variable capacitor 1006. Moreover, since the parasitic capacitances Cpa1 and Cpa2 have fixed values, the amounts of capacitance variation in the first variable capacitor 1005 and the second variable capacitor 1006 would become smaller than their respective spec values, thus resulting in the oscillation frequency range of the differential oscillation circuit 7 being narrowed.

Meanwhile, it has also become commonplace to integrate a differential antenna element on a semiconductor. FIG. 21 is a perspective view illustrating the structure of a conventional planar differential antenna element 7001. In the planar antenna element 7001 shown in FIG. 21, two planar antenna elements 7002 and 70003, which are disposed with a predetermined interval from each other on a silicon substrate 7004 (as one example of a semiconductor substrate), outputs an in-phase signal and a reverse-phase signal, which have the same power but have a 180° phase difference between each other. As a result, the differential antenna element 7001 can receive wide-band signals.

However, when the planar antenna elements 7002 and 7003 are formed on the silicon substrate 7004, the following problems will arise: coupling occurs due to a parasitic capacitance between the wiring and the silicon substrate 7004; and a loss occurs due to the influence of the parasitic resistance on the silicon substrate 7004. As a result, the gain of the differential antenna element 7001 will be deteriorated.

FIG. 22 is a schematic diagram illustrating the structure of a balanced high-frequency device 8001 incorporating a conventional differential resonator. In FIG. 22, the balanced high-frequency device 8001 includes: an input terminal IN for receiving an input signal; a balanced device 8002 having output terminals OUT1 and OUT2 from which to output an in-phase signal and a reverse-phase signal; and a ½ wavelength resonator 8003 (as an example of a differential resonator). When receiving a signal having a predetermined frequency, the ½ wavelength resonator 8003 resonates so as to decrease an impedance of the in-phase signal component, which exists when the output terminals are viewed from the side of the balanced device 8002, so as to be lower than an impedance of the differential signal component which exists when the output terminals are viewed from the side of the balanced device 8002. Thus, the balanced high-frequency device 8001 suppresses the in-phase component, and improves the degree of balance between the output signals.

However, when the ½ wavelength resonator 8003 is formed on a silicon substrate (as an example of a semiconductor substrate), the following problems will arise: coupling occurs due to a parasitic capacitance between the ½ wavelength resonator 8003 and the silicon substrate; and a loss occurs due to the influence of the parasitic capacitance on the silicon substrate. As a result, the insertion loss of the ½ wavelength resonator 8003 will increase.

SUMMARY OF THE INVENTION

Thus, a first object of the present invention is to provide a differential capacitor which is capable of minimizing the influences of parasitic capacitances and parasitic resistances on a differential oscillation circuit.

A second object of the present invention is to provide a differential antenna element which is capable of minimizing the influences of parasitic capacitances and parasitic resistances.

A third object of the present invention is to provide a differential resonator which is capable of minimizing the influences of parasitic capacitances and parasitic resistances.

In order to attain the first object above, a first aspect of the present invention is directed to a differential capacitor comprising a plurality of capacitors, each having an upper electrode and a lower electrode which are substantially parallel to each other along a vertical direction, wherein, any one of the plurality of capacitors is formed on a semiconductor substrate in a substantially symmetrical position from another of the plurality of capacitors with respect to a vertical plane, the differential capacitor further comprises a shield plate interposed between each lower electrode and the semiconductor substrate, and when each lower electrode is projected onto the shield plate along the vertical direction, each projected lower electrode has a partial overlap with the shield plate. As a result, it becomes possible to provide a differential capacitor which is capable of reduce the influences of its own parasitic capacitances and parasitic resistances on a differential oscillation circuit.

Preferably, the partial overlap of each projected lower electrode with the shield plate accounts for 70% or more of an area of the lower electrode. As a preferable example, each projected lower electrode extends outside of the shield plate. As another preferable example, the shield plate has a slit formed therein. More preferably, the slit intersects the vertical plane.

Preferably, the shield plate has a plurality of through-holes formed therein. As a preferable example, the plurality of through-holes are disposed along two predetermined directions at a substantially equal interval, and the interval between adjoining ones of the plurality of through-holes is substantially equal to an integer multiple of ½ a wavelength of standing waves which propagate through the shield plate. More preferably, a length from two predetermined sides of the shield plate to the vertical plane is substantially equal to a sum of an integer multiple of ½ the wavelength of the standing waves and ¼ the wavelength of the standing waves.

Preferably, among the plurality of capacitors, any two capacitors adjoining each other respectively receive an in-phase signal and a reverse-phase signal composing a differential pair of signals.

Preferably, the shield plate is connected to ground via an inductance and/or a resistor. As another preferable example, a portion of the shield plate that intersects the vertical plane is connected to ground.

Preferably, the differential capacitor is used for a variable capacitance circuit in which at least one variable capacitor is connected to each lower electrode or at least one variable capacitor is connected to each upper electrode. More preferably, the area of the partial overlap of each projected lower electrode with the shield plate is determined based on a capacitance variation ratio of the variable capacitance circuit and a quality factor of each capacitor.

As one example, the differential capacitor may be used in a differential oscillation circuit. As another example, the differential capacitor may be used in a switching circuit in which at least one switch element is connected to each of the first lower electrode and the second lower electrode. More preferably, the area of the partial overlap of each projected lower electrode with the shield plate is determined based on an isolation when the switching circuit is off and a quality factor of each capacitor. As another example, the differential capacitor may be used in a differential switching circuit.

Preferably, a first one of the plurality of capacitors is formed on the semiconductor substrate in a substantially symmetrical position from one of the plurality of capacitors with respect to the vertical plane, a second one of the plurality of capacitors is formed on the semiconductor substrate in a substantially symmetrical position from the one capacitor with respect to a further vertical plane which lies perpendicular to the vertical plane, and a third one of the plurality of capacitors is formed on the semiconductor substrate in a substantially symmetrical position from the one capacitor with respect to a line of intersection between the vertical plane and the further vertical plane.

More preferably, an in-phase signal and a reverse-phase signal composing a differential pair of signals are supplied to the plurality of capacitors in such a manner that one of the in-phase signal or the reverse-phase signal is supplied to both the one capacitor and the third capacitor and that the other of the in-phase signal or the reverse-phase signal is supplied to both the first and second capacitors.

More preferably, the shield plate has a plurality of through-holes formed therein, the through-holes being disposed along two predetermined directions at a substantially equal interval, such that the interval between adjoining ones of the plurality of through-holes is substantially equal to an integer multiple of ½ a wavelength of standing waves which propagate through the shield plate, and the shield plate has a substantially rectangular shape such that a length from two predetermined sides of the shield plate to the vertical plane and a length from the other two sides of the shield plate to the further vertical plane are each substantially equal to a sum of an integer multiple of ½ the wavelength of the standing waves and ¼ the wavelength of the standing waves.

In order to attain the second object above, a second aspect of the present invention is directed to a differential antenna element comprising: a plurality of antenna elements which are formed on a semiconductor substrate in substantially symmetrical positions from each other with respect to a vertical plane; and a shield plate interposed between each antenna element and the semiconductor substrate, wherein, when each antenna element is projected onto the shield plate along the vertical direction, each projected antenna element has a partial overlap with the shield plate. As a result, it becomes possible to provide a differential antenna element which is capable of reduce the influences of parasitic capacitances and parasitic resistances.

Preferably, each projected antenna element extends outside of the shield plate. As another preferable example, the shield plate has a slit formed therein. More preferably, the slit intersects the vertical plane.

Preferably, the shield plate has a plurality of through-holes formed therein.

Preferably, among the plurality of antenna elements, any two antenna elements adjoining each other respectively receive an in-phase signal and a reverse-phase signal composing a differential pair of signals.

Preferably, the shield plate is connected to ground via an inductance and/or a resistor. As another preferable example, a portion of the shield plate that intersects the vertical plane is connected to ground.

In order to attain the third object above, a third aspect of the present invention is directed to a differential resonator formed on a semiconductor substrate, comprising: at least one dielectric planar plate having a substantially symmetrical shape with respect to a vertical plane and having two terminals which are in substantially symmetrical positions from each other with respect to the vertical plane; and a shield plate which is disposed between the at least one planar plate and the semiconductor substrate, wherein, when the at least one planar plate is projected onto the shield plate along the vertical direction, the at least one projected planar plate has a partial overlap with the shield plate. As a result, it becomes possible to provide a differential resonator which is capable of reduce the influences of parasitic capacitances and parasitic resistances.

Preferably, the at least one projected planar plate extends outside of the shield plate. As another preferable example, the shield plate has a slit formed therein. More preferably, the slit intersects the vertical plane.

Preferably, the shield plate has a plurality of through-holes formed therein.

Preferably, an in-phase signal and a reverse-phase signal composing a differential pair of signals are respectively applied to the two terminals of the at least one planar plate.

The shield plate may be connected to ground via an inductance and/or a resistor. As another preferable example, a portion of the shield plate that intersects the vertical plane is connected to ground.

As one example, the differential resonator may be used in a filter circuit.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1A:
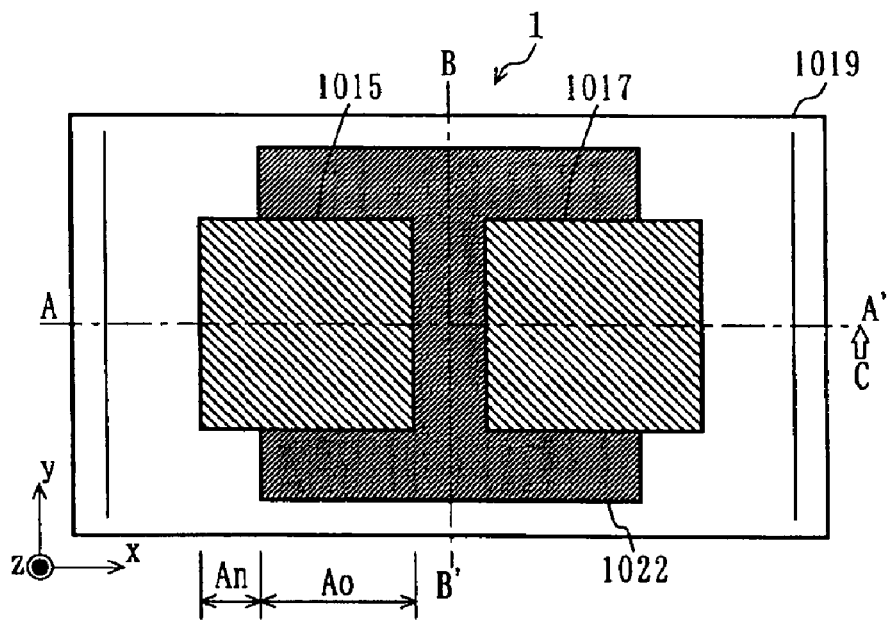
FIG. 1A is an upper plan view illustrating the structure of a differential capacitor 1 according to a first embodiment of the present invention.
Figure 1B:
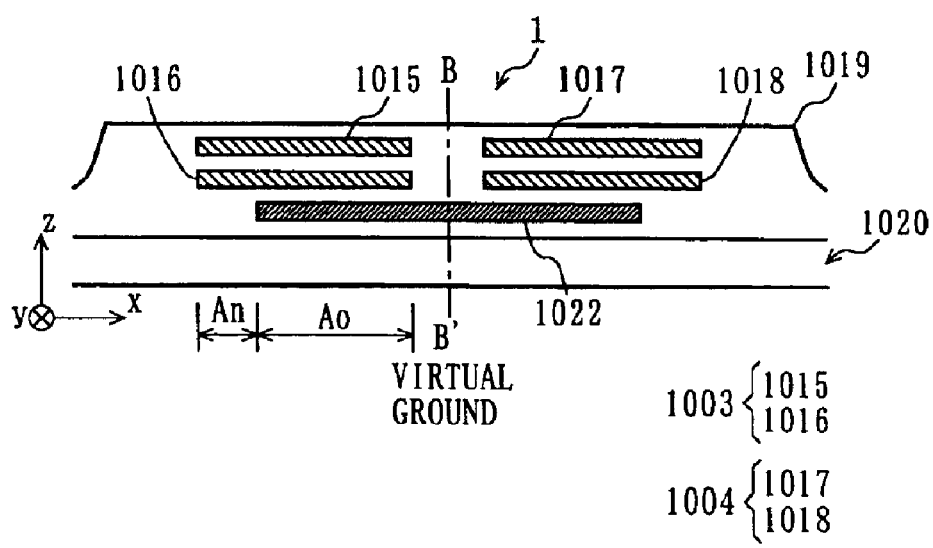
FIG. 1B is a schematic diagram showing a cross section of the differential capacitor 1 taken at a vertical plane A–A' in FIG. 1A, as viewed in the direction of arrow C.

FIG. 1A is a schematic diagram illustrating a differential capacitor 1 according to a first embodiment of the present invention as viewed from vertically above. FIG. 1B is a schematic diagram showing a cross section of the differential capacitor 1 taken at a vertical plane A–A' in FIG. 1A, as viewed in the direction of arrow C. In order to facilitate explanation, FIGS. 1A and 1B also show a three-dimensional coordinate system having three orthogonal axes of x, y, and z, where the z axis corresponds to the vertically upward direction, and the x and y axes correspond to the two respectively perpendicular directions on the horizontal plane. Note that the y axis is in the same direction as that of arrow C, and extends in parallel to a vertical plane B–B' described later.

In FIGS. 1A and 1B, the differential capacitor 1 comprises a first capacitor 1003, a second capacitor 1004, and a shield plate 1022. The first and second capacitors 1003 and 1004 are formed within an interlayer film 1019 on the semiconductor substrate 1020. The semiconductor substrate 1020 and the interlayer film 1019 are identical to those described above in the "Description of the Background Art" section. The first capacitor 1003 and the second capacitor 1004 are composed of metal wires which are typically aluminum. The first capacitor 1003 includes an upper electrode 1015 and a lower electrode 1016, which lie substantially parallel to each other in the z-axis direction (i.e., the vertical direction) with a predetermined interval therebetween. The upper electrode 1015 and the lower electrode 1016 are formed in positions which are away from the vertical plane B–B' by a predetermined distance in a minus direction of the x axis. The second capacitor 1004 includes an upper electrode 1017 and a lower electrode 1018, which have substantially symmetrical configurations to those of the upper electrode 1015 and the lower electrode 1016, respectively, with respect to the vertical plane B–B'.

The shield plate 1022 is a plate-like component composed of a conductive material such as aluminum, which has a symmetrical shape with respect to the vertical plane B–B' along the horizontal direction. The shield plate 1022 is interposed between the semiconductor substrate 1020 and both lower electrodes 1016 and 1018. The shield plate 1022 has a shape such that, when the lower electrodes 1016 and 1018 are projected onto the shield plate 1022 from vertically above, the projected lower electrodes 1016 and 1018 appear as partially overlapping with the shield plate 1022. In the present embodiment, the shield plate 1022 is shaped so that the projected lower electrodes 1016 and 1018 extend outside of the outer contour of the shield plate 1022. Hereinafter, a portion of each of the lower electrodes 1016 and 1018 whose projected image overlaps with the shield plate 1022 will be referred to as an "overlapping region Ao", and the rest will be referred to as a "non-overlapping region An".

Figure 2:
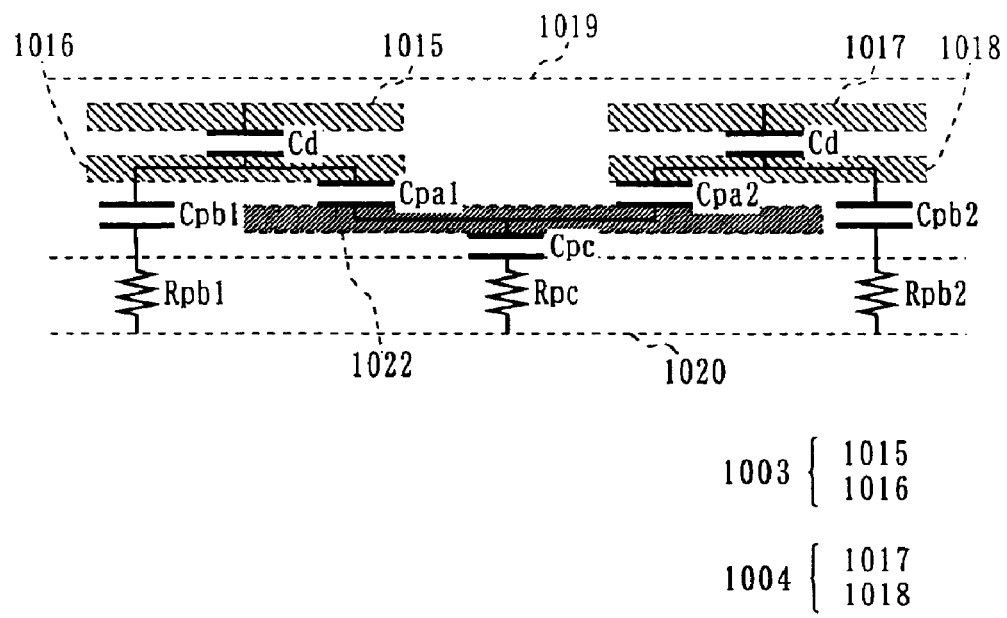
FIG. 2 is a schematic diagram showing an equivalent circuit of the differential capacitor 1 shown in FIG. 1.

FIG. 2 is a schematic diagram showing an equivalent circuit of the differential capacitor 1 shown in FIG. 1. FIG. 2 shows, by a dotted line, a cross section of the differential capacitor 1 taken along the vertical plane A–A'. In FIG. 2, the first capacitor 1003 and the second capacitor 1004 each have a predetermined capacitance Cd. When an in-phase signal and a reverse-phase signal are respectively supplied to the first capacitor 1003 and the second capacitor 1004, or vice versa, parasitic capacitances Cpa1 and Cpa2 occur between the shield plate 1022 and the lower electrodes 1016 and 1018, respectively. Moreover, a parasitic capacitance Cpc and a parasitic resistance Rpc occur between the shield plate 1022 and the semiconductor substrate 1020. Furthermore, a parasitic capacitance Cpb1 and a parasitic resistance Rpb1 occur between the lower electrode 1016 and the semiconductor substrate 1020. Further still, a parasitic capacitance Cpb2 and a parasitic resistance Rpb2 occur between the lower electrode 1018 and the semiconductor substrate 1020.

Figure 19A:
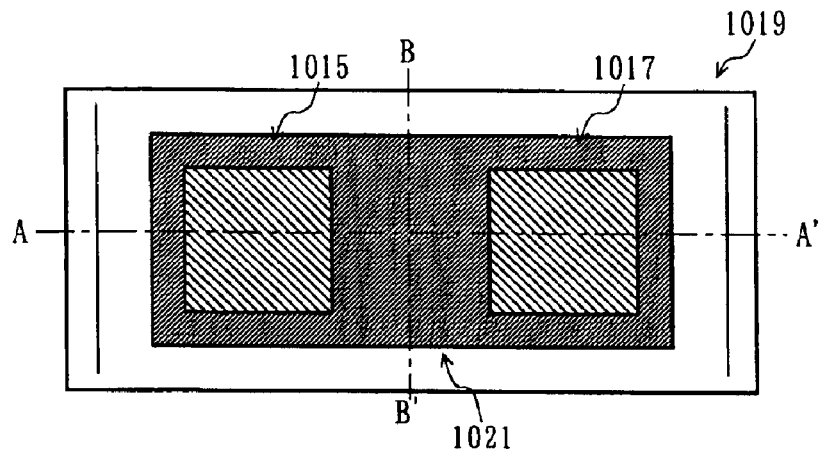
FIGS. 19A and 19B are schematic diagrams illustrating the structure of a conventional differential capacitor.
Figure 19B:
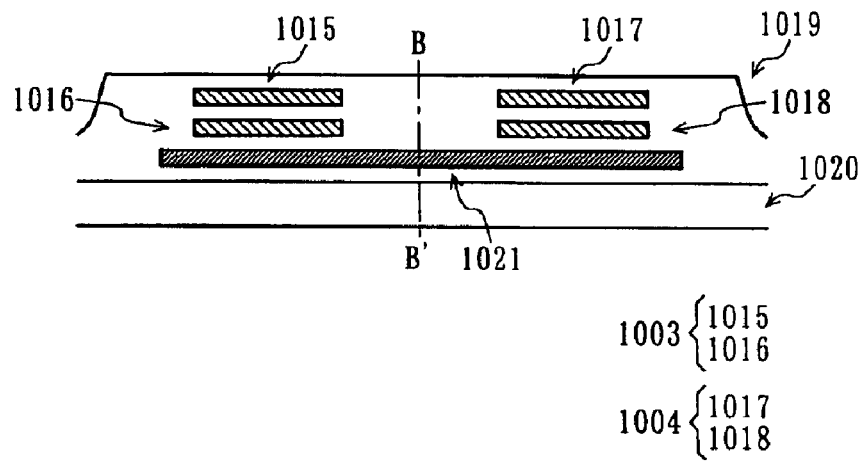
Figure 20:
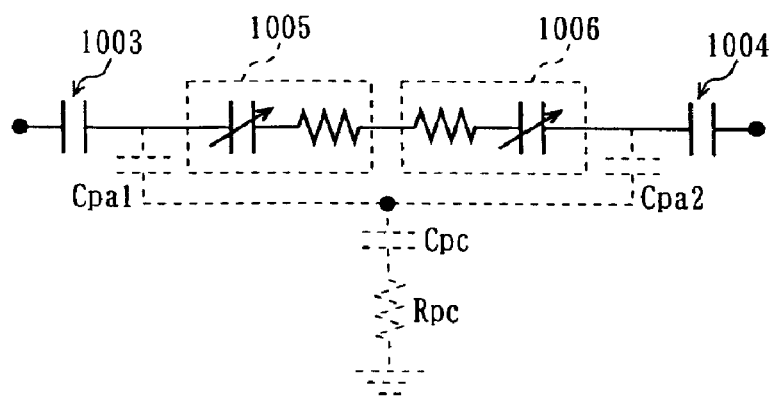
FIG. 20 is a schematic diagram showing an equivalent circuit of the differential capacitor shown in FIGS. 19A and 19B.
Figure 21:
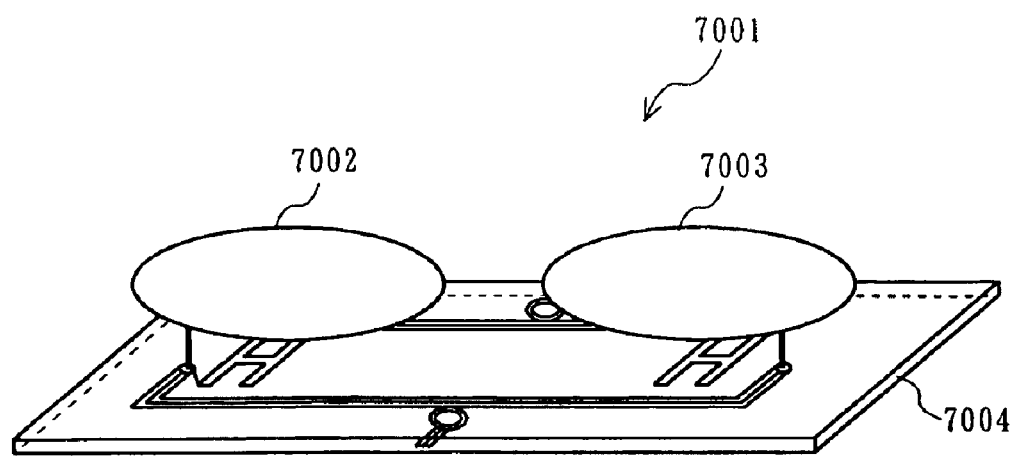
FIG. 21 is a perspective view illustrating the structure of a conventional planar differential antenna element 7001.
Figure 22:
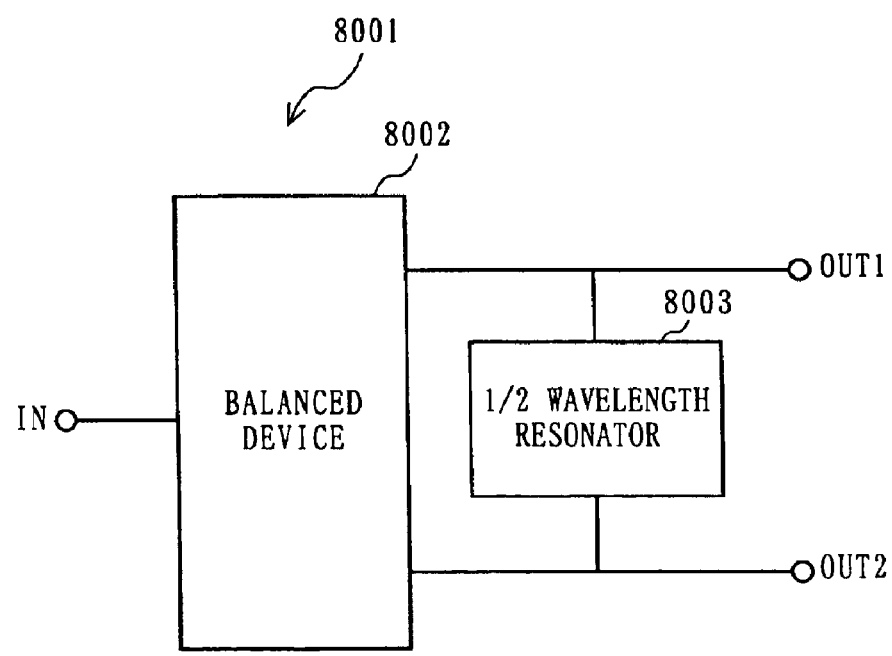
FIG. 22 is a schematic diagram illustrating the structure of a balanced high-frequency device 8001 incorporating a conventional differential resonator.

In the conventional differential capacitor, the non-overlapping region An (see FIGS. 19A and 19B and FIG. 20) is lacking, so that the parasitic capacitance Cpa1 occurring between the lower electrode 1016 and the shield plate 1021 would generally depend on the physical area of the lower electrode 1016 and the distance between the lower electrode 1016 and the shield plate 1021. This is also true of the conventional lower electrode 1018.

On the other hand, in accordance with the differential capacitor 1 according to the present embodiment (see FIGS. 1A and 1B and FIG. 2), the parasitic capacitance which is associated with the lower electrode 1016 generally depends on an area So of the overlapping region Ao, a distance Do between the overlapping region Ao and the shield plate 1022, an area Sn of the non-overlapping region An, and a distance Dn between the non-overlapping region An and the semiconductor substrate 1020. This is also true of the lower electrode 1018 of the differential capacitor 1.

Assuming that the area of the conventional lower electrode 1016 (see FIG. 19B) is equal to the area of the lower electrode 1016 (see FIG. 1B) according to the present embodiment, the parasitic capacitance which occurs per unit area of the lower electrode 1016 of the present differential capacitor 1 is smaller than that of the conventional lower electrode 1016, since the distance Dn is physically greater than the distance Do. This is also true of the lower electrode 1018 of the differential capacitor 1.

Figure 17:
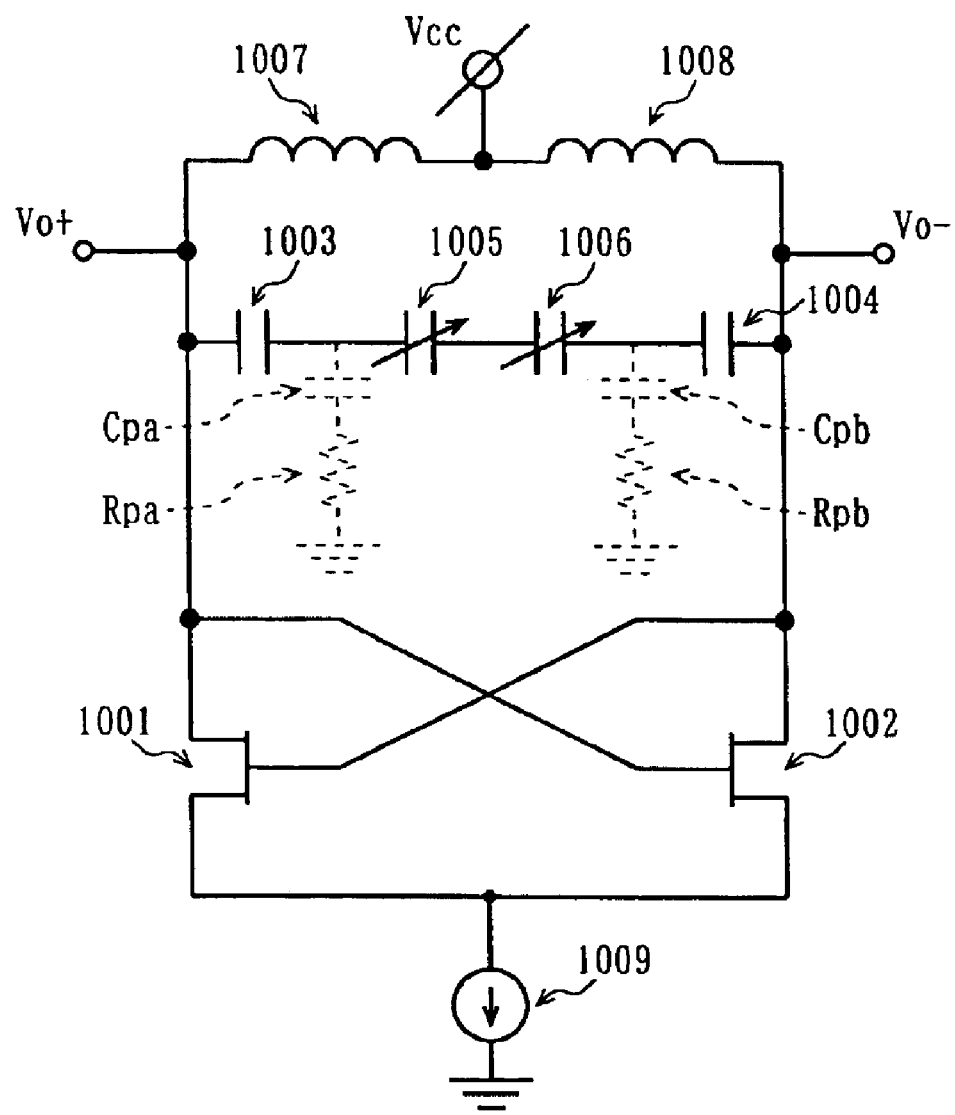
FIG. 17 is a schematic diagram illustrating the structure of a conventional commonly-used differential oscillation circuit 7.
Figure 18A:
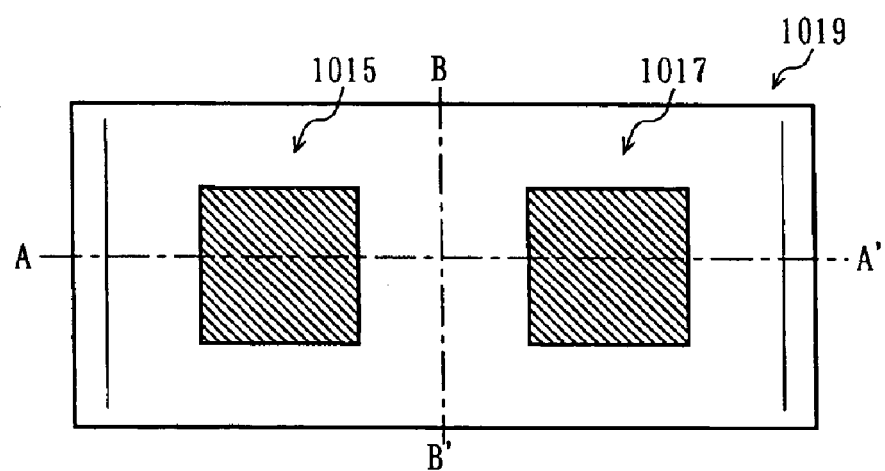
FIGS. 18A and 18B are schematic diagrams illustrating the structure of a commonly-used differential capacitor.
Figure 18B:
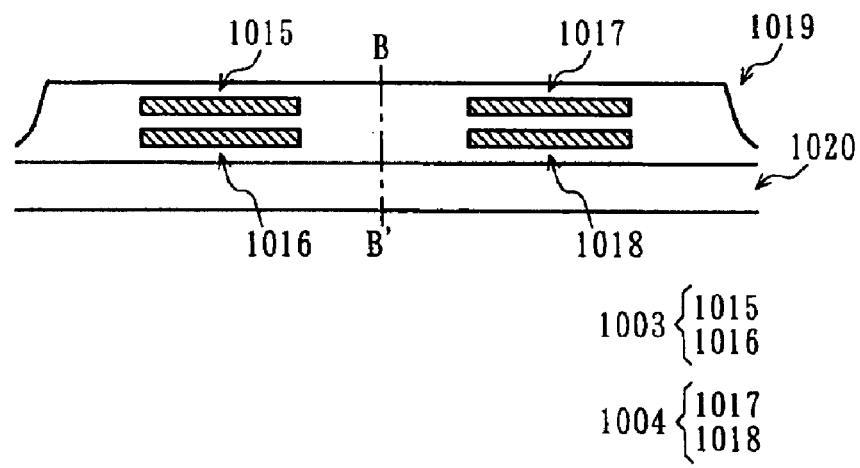

In order to reduce the parasitic capacitance of the lower electrode 1016 per unit area, the area of the overlapping region Ao may be reduced. However, reducing the overlapping region Ao would result in the parasitic capacitance Cpb1 being greater than the parasitic capacitance Cpa1, so that quality factor of the first capacitor 1003 would be greatly deteriorated due to the influence of the parasitic resistance Rpb1. In other words, a trade-off relationship exists between the parasitic capacitance of the lower electrode 1016 per unit area and the parasitic resistance Rpb1. If the differential capacitor 1 which is so susceptible to the influence of the parasitic resistance Rpb1 were to be applied to the differential oscillation circuit 7 (see FIG. 17), the quality factor of the entire circuit would be deteriorated.

Figure 3:
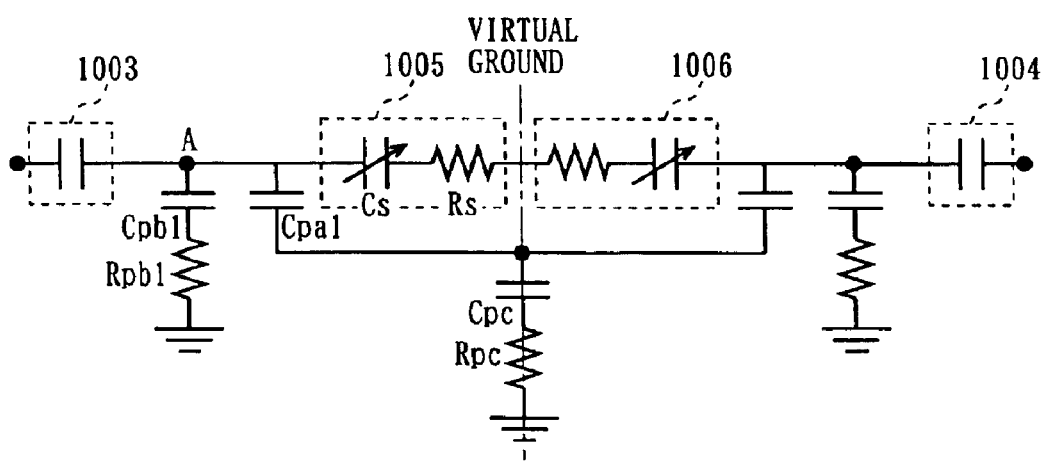
FIG. 3 is a schematic diagram showing the structure of a portion of a differential oscillation circuit 7 to which the differential capacitor 1 in FIG. 1 is applied.

FIG. 3 is a schematic diagram showing the structure of a portion of a differential oscillation circuit 7 to which the present differential capacitor 1 is applied, this portion including the first and second capacitors 1003 and 1004 and the first and second variable capacitors 1005 and 1006. It is assumed that the first capacitor 1003 has the aforementioned capacitance Cd, and the first variable capacitor 1005 has a capacitance Cs. FIG. 3 shows the parasitic capacitances Cpa1 and Cpb1 and the parasitic resistance Rpb1 of the first capacitor 1003 as well as the parasitic resistance Rs of the first variable capacitor 1005.

Hereinafter, with reference to FIG. 3, the aforementioned trade-off relationship will be described from the perspective of the capacitance variation ratio of the first variable capacitor 1005 and the quality factor of the circuit shown in FIG. 3. In FIG. 3, an in-phase signal and a reverse-phase signal are respectively supplied to the first capacitor 1003 and the second capacitor 1004, or vice versa. Furthermore, the differential oscillation circuit 7 has symmetry with respect to the virtual ground for AC signals (as indicated by a dot-dash line). Since the capacitance variation ratio and the quality factor of the second variable capacitor 1006 are therefore similar to those of the first variable capacitor 1005, the descriptions thereof are omitted. In FIGS. 1 and 2, the virtual ground corresponds to a portion of the shield plate 1022 that intersects the vertical plane B–B'.

In FIG. 3, an admittance Y between anode A and the virtual ground can be expressed by equation (1) below:

$$Y = \frac{1}{Rs - \frac{j}{2\pi f C s}} + \frac{1}{Rpb1 - \frac{j}{2\pi f C p b 1}} + j2\pi f C p a \quad (1)$$

where f is frequency.

Figure 4:
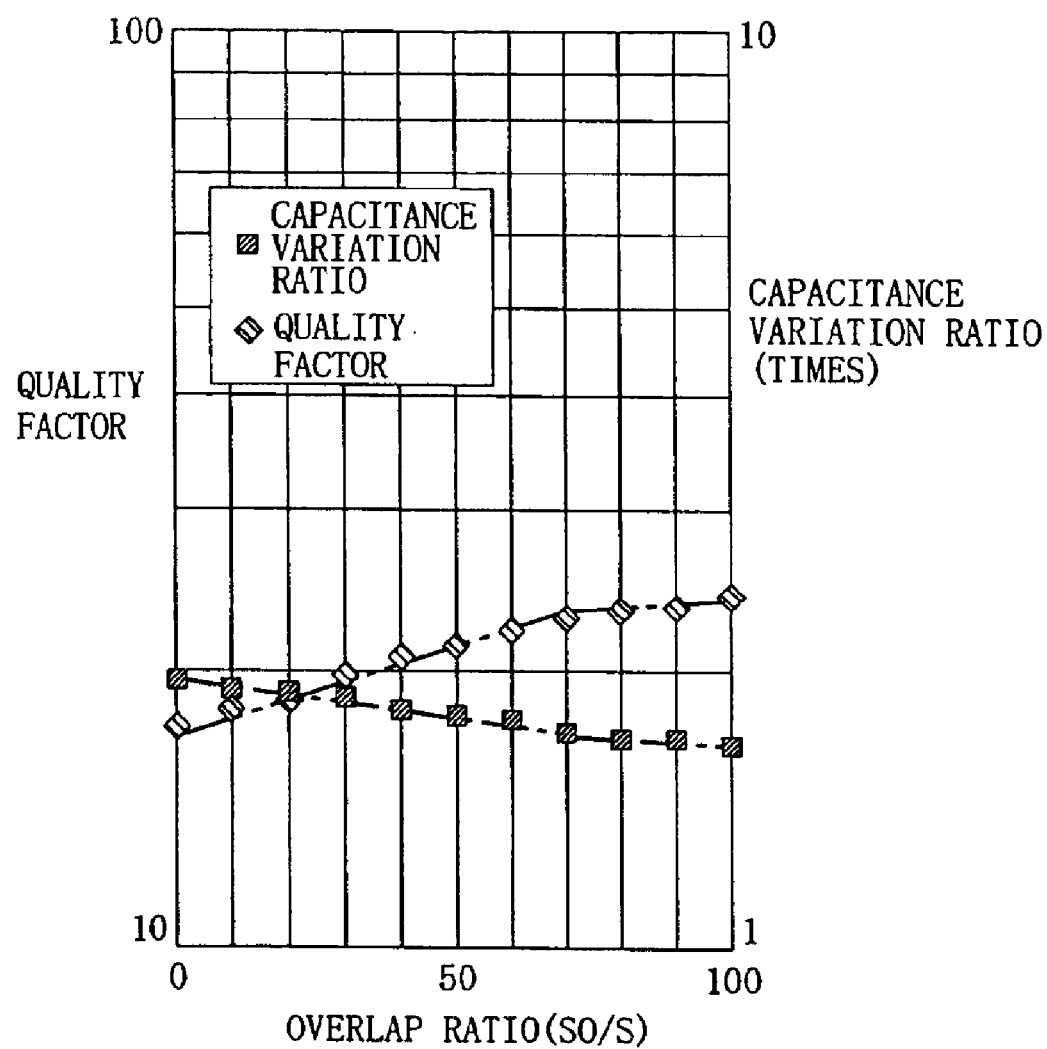
FIG. 4 is a graph showing characteristic curves indicating a capacitance variation ratio and a quality factor of a first variable capacitor 1005 in FIG. 3.

FIG. 4 is a graph showing characteristic curves indicating a 1/Y capacitance variation, i.e., a capacitance variation ratio of the first variable capacitor 1005, and the quality factor of the first variable capacitor 1005. In FIG. 4, the left-side vertical axis represents the quality factor; the right-side vertical axis represents the capacitance variation ratio; and the horizontal axis represents the overlap ratio. As used herein, the capacitance variation ratio is a value which is obtained by dividing the maximum capacitance value of the first variable capacitor 1005 by the minimum capacitance value, and is thus indicated by units of multiples. The overlap ratio is defined as (So/S)×100[%], where S is the area of the lower electrode 1006 and So is the area of the overlapping region Ao. The characteristic curves of FIG. 4 were measured under the following conditions: the parasitic resistance Rs was 2Ω; the parasitic resistance Rpb1 was 150Ω; the parasitic capacitance Cpa1 was 0.8 pF when the overlap ratio was 100%; and the parasitic capacitance Cpb1 was 0.2 pF when the overlap ratio was 0%. It is assumed that the first variable capacitor 1005 varies in the range from 4 pF to 2 pF according to the device specifications. In other words, the first variable capacitor 1005 has a capacitance variation ratio of 2 [times].

As shown in FIG. 4, the parasitic capacitance Cpb1 becomes increasingly smaller than the parasitic capacitance Cpa1 as the overlap ratio is increased, so that the quality factor of the entire circuit as shown in FIG. 3 is improved. As a result, the influence of the parasitic resistance Rpb1 on the first variable capacitor 1005 is reduced, whereby the deterioration of the quality factor of the entire circuit as shown in FIG. 3 can be minimized. Conversely, the capacitance variation ratio of the first variable capacitor 1005 becomes closer to "2" [times] as the overlap ratio is decreased. Thus, by referring to the above two characteristic curves, an optimum overlap ratio, which minimizes deterioration in both the quality factor and the capacitance variation ratio, is chosen at around 70% in the present embodiment. However, instead of selecting an overlap ratio of about 70% for minimizing deterioration in both the quality factor and the capacitance variation ratio as in the present embodiment, the overlap ratio may be selected from other perspectives. For example, in order to attach more importance to the deterioration in the quality factor, the overlap ratio may be selected to be equal to or greater than about 70% and less than 100%. On the other hand, in order to attach more importance to the deterioration in the capacitance variation ratio, the overlap ratio may be selected to be above 0% and equal to or less than about 70%.

Thus, in accordance with the differential capacitor 1 of the present embodiment, the shield plate 1022 is provided and an appropriate overlap ratio therewith is selected. As a result, the influences which the parasitic capacitances and the parasitic resistances in the differential capacitor 1 exert on the differential oscillation circuit 7 can be reduced. In other words, deterioration in the quality factor of the differential oscillation circuit 7 can be prevented. Also, deterioration in the capacitance variation ratios of the variable capacitor 1005 and the 1006 can be prevented. As a result, the oscillation frequency range of the differential oscillation circuit 7 can be prevented from becoming narrower.

Figure 5A:
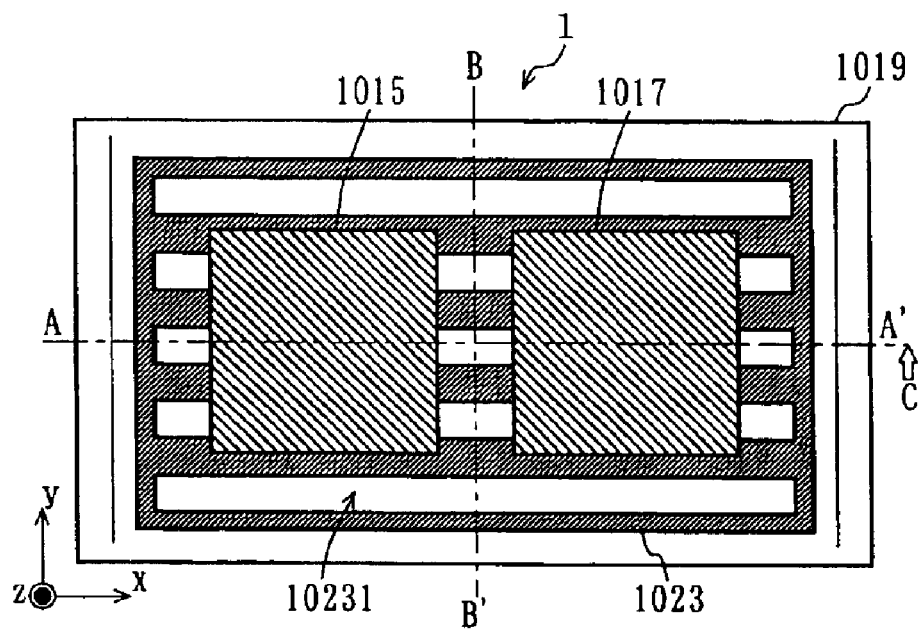
FIG. 5A is a schematic diagram showing a shield plate 1023 (as a first alternative to a shield plate 1022 shown in FIG. 1) as viewed from vertically above.
Figure 5B:
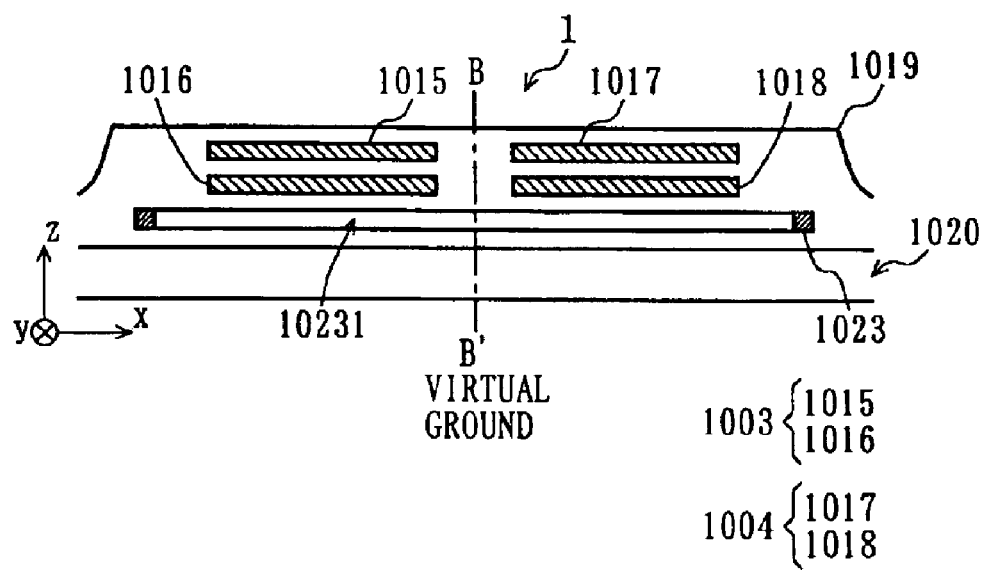
FIG. 5B is a schematic diagram showing a cross section of the shield plate 1023 taken at a vertical plane A–A' in FIG. 5A, as viewed in the direction of arrow C.

Instead of the shield plate 1022, the differential capacitor 1 may comprise a shield plate 1023 as shown in FIGS. 5A and 5B. FIG. 5A is a schematic diagram showing the shield plate 1023 as viewed from vertically above. FIG. 5B is a schematic diagram showing a cross section of the shield plate 1023 taken at a vertical plane A–A' in FIG. 5A, as viewed in the direction of arrow C.

In FIGS. 5A and 5B, the shield plate 1023 is a plate-like component composed of a conductive material, which has a symmetrical shape with respect to the vertical plane B–B', as is the case with the shield plate 1022. The shield plate 1022 is interposed between the semiconductor substrate 1020 and both lower electrodes 1016 and 1018. The shield plate 1023 has one or more slits 10231 formed therein. Preferably, the slit(s) 10231 is formed so as to be substantially parallel to the x-axis direction and perpendicular to the aforementioned virtual ground. Furthermore, in order to prevent deterioration in both the quality factor and the capacitance variation ratio, it is preferable that the slit(s) 10231 is formed so that the above-defined optimum overlap ratio is about 70%. In the case where there are a plurality of slits 10231, the slits 10231 are preferably formed so as to extend in parallel to each other along the x-axis direction.

Although the slits 10231 may be formed so as to be parallel to the y-axis direction, in this case any leak component from the differential capacitor 1 would take a long time to arrive at the virtual ground, and propagate through the shield plate 1023 in a substantially spiral manner. As a result, an inductance component occurs in the shield plate 1023, thereby deteriorating the shielding effect.

Figure 6A:
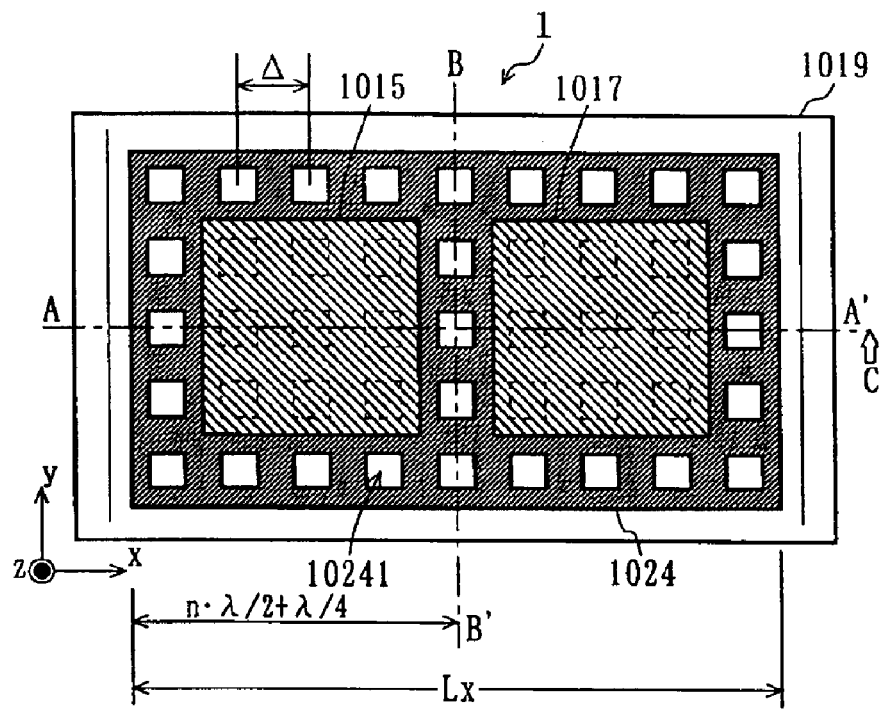
FIG. 6A is a schematic diagram showing a shield plate 1024 (as a second alternative to a shield plate 1022 shown in FIG. 1) as viewed from vertically above.
Figure 6B:
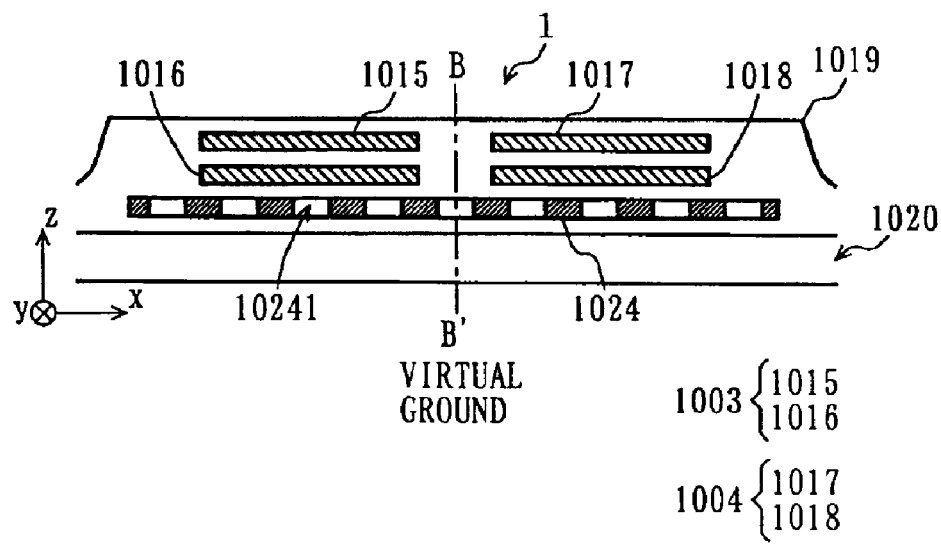
FIG. 6B is a schematic diagram showing a cross section of the shield plate 1024 taken at a vertical plane A–A' in FIG. 6A, as viewed in the direction of arrow C.

Instead of the shield plate 1022, the differential capacitor 1 may comprise a shield plate 1024 as shown in FIGS. 6A and 6B. FIG. 6A is a schematic diagram showing the shield plate 1024 as viewed from vertically above. FIG. 6B is a schematic diagram showing a cross section of the shield plate 1024 taken at a vertical plane A–A' in FIG. 6A, as viewed in the direction of arrow C.

In FIGS. 6A and 6B, the shield plate 1024 is preferably a plate-like piece of conductive material which is symmetrical with respect to the vertical plane B–B', as is the case with the shield plate 1022. The shield plate 1024 has a substantially rectangular shape, such that each of the two sides extend in parallel to the x-axis direction has a length of Lx.

A plurality of through-holes 10241 are formed in the shield plate 1024, in such a manner that the above-defined optimum overlap ratio equals about 70% in order to prevent deterioration in both the quality factor and the capacitance variation ratio. For clarity, only one of the through-holes is labeled as "10241" in FIGS. 6A and 6B. Preferably, the through-holes 10241 are arranged so as to be substantially parallel to both the x-axis direction and the y-axis direction. In this case, there is an odd number of linear arrays of through-holes 10241 which are arranged in parallel to they-axis direction (hereinafter referred to as "columns") (nine such columns are shown in FIGS. 6A and 6B). Any two adjoining through-holes 10241 along the x-axis direction are disposed apart by a distance Δ between their respective centers.

An in-phase signal and a reverse-phase signal also leak from the differential capacitor 1 to the shield plate 1024. The wavelength of such leak components depends on the frequency of the in-phase signal and the reverse-phase signal, and therefore is known. Assuming that the leak component has a wavelength of the distance from each of the two sides of the shield plate 1024 extending in parallel to the y axis to the virtual ground (vertical plane B–B') is prescribed to be n·λ/2+λ/4. That is, Lx=λ(n+½), where n indicates the number of columns (n being an integer which is equal to or greater than zero).

Figure 7:
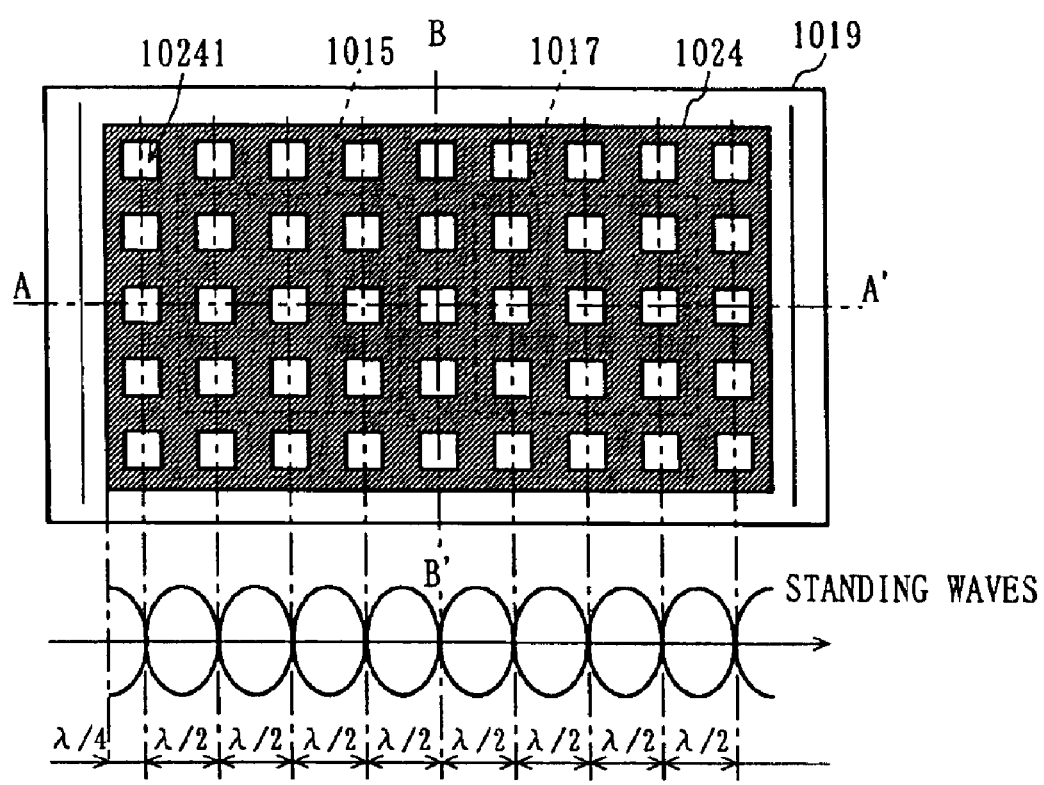
FIG. 7 is a schematic diagram illustrating standing waves which are propagated through the shield plate 1024 shown in FIGS. 6A and 6B.

As shown in FIG. 7, standing waves having a wavelength of λ will propagate on the shield plate 1024. Such standing waves have nodes at every λ/2 centered around the virtual ground. Since the amplitude of the standing waves is small at each node, it is preferable that the through-holes 10241 are formed in positions corresponding to the nodes, i.e., Δ=λ/2. Thus, the standing waves can be prevented from leaking from each through-hole 10241 to the semiconductor substrate 1020. As a result, the deterioration in the quality factor of the differential capacitor 1 can be prevented.

Although a lattice-like array of through-holes 10241 is shown in FIGS. 6A and 6B, other arrangements are also possible. For example, the through-holes 10241 may be arranged in concentric circles centered around a point on the virtual ground, with a distance of Δ between every two adjoining concentric circles.

In the differential capacitor 1, the shield plate 1022, 1023, or 1024 may be connected to ground (not shown) via an inductance and/or a resistance, in order to prevent charge accumulation. Alternatively, the virtual ground in the shield plate 1022, 1023, or 1024 may directly be electrically connected to ground (not shown) in order to prevent charge accumulation in the shield plate 1022, 1023, or 1024.

(Second Embodiment)

Figure 8A:
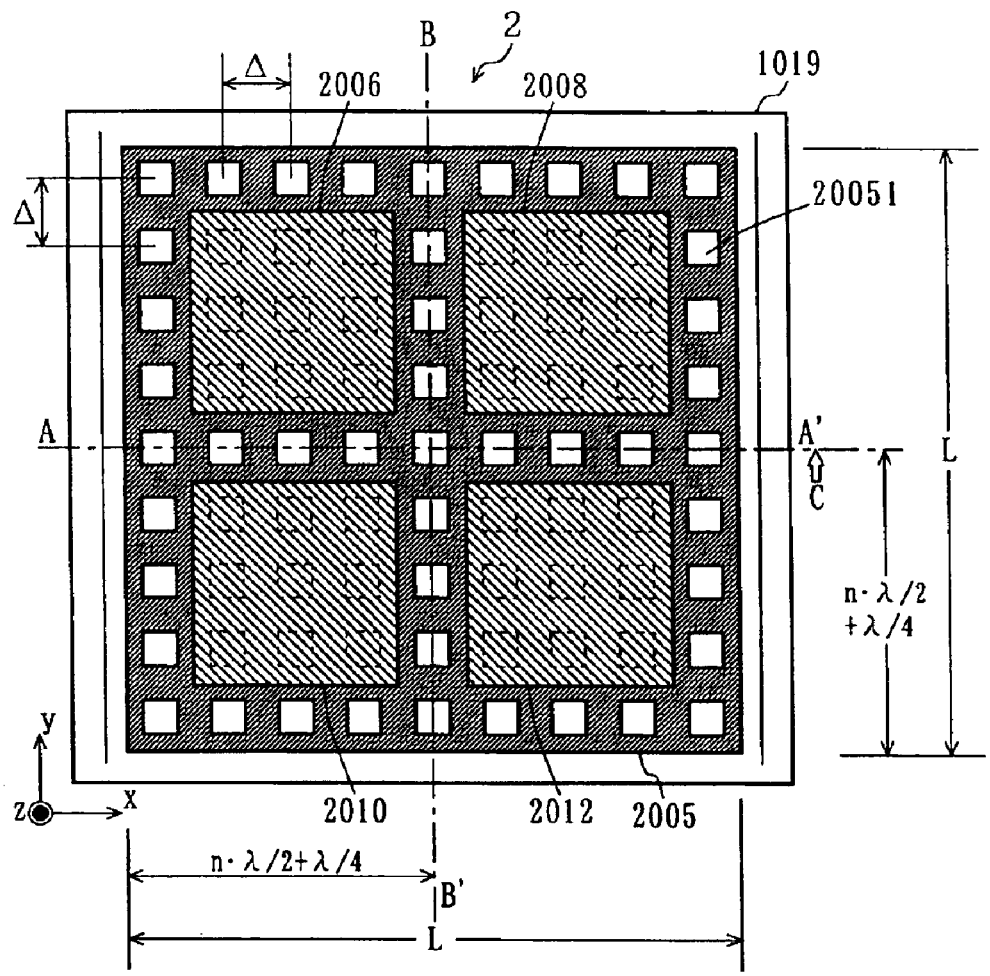
FIG. 8A is a schematic diagram illustrating a differential capacitor 2 according to a second embodiment of the present invention as viewed from vertically above.
Figure 8B:
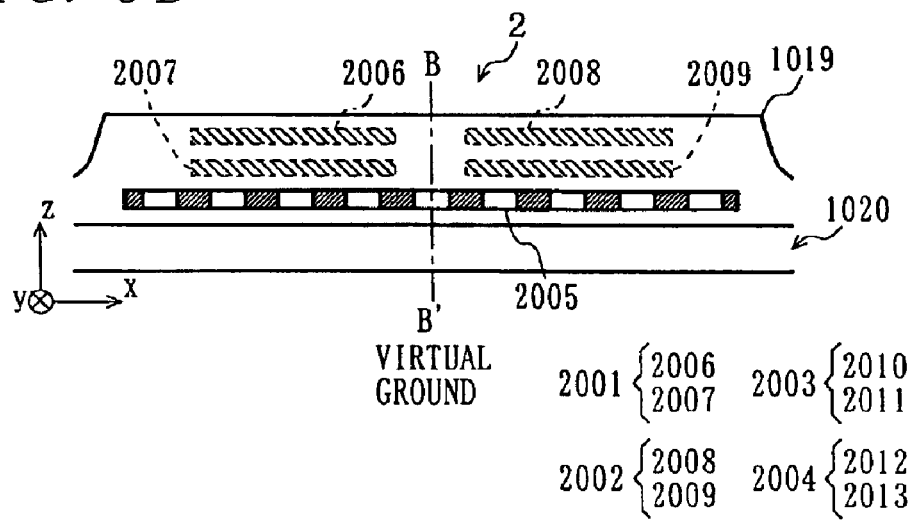
FIG. 8B is a schematic diagram showing a cross section of the differential capacitor 2 taken at a vertical plane A–A' in FIG. 8A, as viewed in the direction of arrow C.

FIG. 8A is a schematic diagram illustrating a differential capacitor 2 according to a second embodiment of the present invention as viewed from vertically above. FIG. 8B is a schematic diagram showing a cross section of the differential capacitor 2 taken at a vertical plane A–A' in FIG. 8A, as viewed in the direction of arrow C. In order to facilitate explanation, FIGS. 8A and 8B also show a three-dimensional coordinate system having three orthogonal axes of x, y, and z, where the z axis corresponds to the vertically upward direction, and the x and y axes correspond to the two respectively perpendicular directions on the horizontal plane. Note that the y axis is in the same direction as that of arrow C, and extends in parallel to a vertical plane B–B' described later.

In FIGS. 8A and 8B, the differential capacitor 2 comprises first to fourth capacitors 2001 to 2004 and a shield plate 2005. The first to fourth capacitors 2001 to 2004 are formed in an interlayer film 1019 on the semiconductor substrate 1020. The semiconductor substrate 1020 and the interlayer film 1019 are identical to those described above in the "Description of the Background Art" section. The first to fourth capacitors 2001 to 2004 are composed of metal wires which are typically aluminum. The first capacitor 2001 includes an upper electrode 2006 and a lower electrode 2007, which are disposed substantially parallel to each other with a predetermined interval along the z-axis direction (along the vertical direction). The upper electrode 2006 and the lower electrode 2007 are formed in positions which are away from the vertical plane A–A' (which extends in parallel to the x-axis direction) by a predetermined distance in a plus direction of the y axis, and away from the vertical plane B–B' (which extends in parallel to the y-axis direction) by a predetermined distance in the minus direction of the x axis.

The second capacitor 2002 includes an upper electrode 2008 and a lower electrode 2009, which have substantially symmetrical configurations to those of the upper electrode 2006 and the lower electrode 2007, respectively, with respect to the vertical plane B–B'. The third capacitor 2003 includes an upper electrode 2010 and a lower electrode 2011 (not explicitly shown), which have substantially symmetrical configurations to those of the upper electrode 2006 and the lower electrode 2007, respectively, with respect to the vertical plane A–A'. The fourth capacitor 2004 includes an upper electrode 2012 and a lower electrode 2013 (not explicitly shown), which have substantially symmetrical configurations to those of the upper electrode 2008 and the lower electrode 2009, respectively, with respect to the vertical plane A–A'.

The shield plate 2005 is preferably a plate-like piece of conductive material which is symmetrical with respect to the vertical plane A–A' and with respect to the vertical plane B–B'. More specifically, the shield plate 2005 has a substantially square shape, each side having a length of L. The shield plate 2005 is disposed so as to come between the semiconductor substrate 1020 and all of the lower electrode 2007, 2009, 2011, and 2013.

A plurality of through-holes 20051 are formed in the shield plate 2005. For clarity, only one of the through-holes is labeled as "20051" in FIGS. 8A and 8B. The through-holes 2005 are arranged in the x-axis direction and in the y-axis direction. There are an odd number linear arrays of through-holes 20051 extending in parallel to the y axis and an odd number linear arrays of through-holes 20051 extending in parallel to the x axis (nine such arrays are shown in FIGS. 8A and 8B). Hereinafter, the linear arrays of through-holes 20051 extending in parallel to the y axis will be referred to as "columns", whereas the linear arrays of through-holes 20051 extending in parallel to the x axis will be referred to as "rows". The through-holes 20051 are disposed in such a manner that the center of each of the through-holes 20051 composing the central column is on a line at which the shield plate 2005 is intersected by the vertical plane B–B' and that the center of each of the through-holes 20051 composing the central row is on a line at which the shield plate 2005 is intersected by the vertical plane A–A'. Any two adjoining through-holes 20051 along the x-axis direction or the y-axis direction are disposed apart by a distance Δ between their respective centers.

In the differential capacitor 2 having the above structure, an in-phase signal composing a differential pair of signals is supplied to the first capacitor 2001 and the fourth capacitor 2004, which are formed in point-symmetrical positions from each other with respect to an intersection between the vertical plane A–A', the vertical plane B–B', and the shield plate 2005. A reverse-phase signal composing the differential pair of signals is supplied to the second capacitor 2002 and the third capacitor 2003, which are formed in point-symmetrical positions from each other with respect to the aforementioned intersection. By supplying the in-phase signal and the reverse-phase signal in this manner, it becomes possible to reduce the influences which the parasitic capacitances and parasitic resistances in the differential capacitor 2 exert on the differential oscillation circuit 7, as in the first embodiment.

For the same reason as that described in the first embodiment, the distance from each of the two sides of the shield plate 2005 extending in parallel to the y axis to the virtual ground (vertical plane B–B') and the distance from each of the two sides of the shield plate 2005 extending in parallel to the x axis to the virtual ground (vertical plane A–A') is each prescribed to be n·λ/2+λ/4, where n indicates the number of columns and rows (n being an integer which is equal to or greater than zero). For the same reason as that described in the first embodiment, it is preferable that Δ=λ/2.

Figure 9:
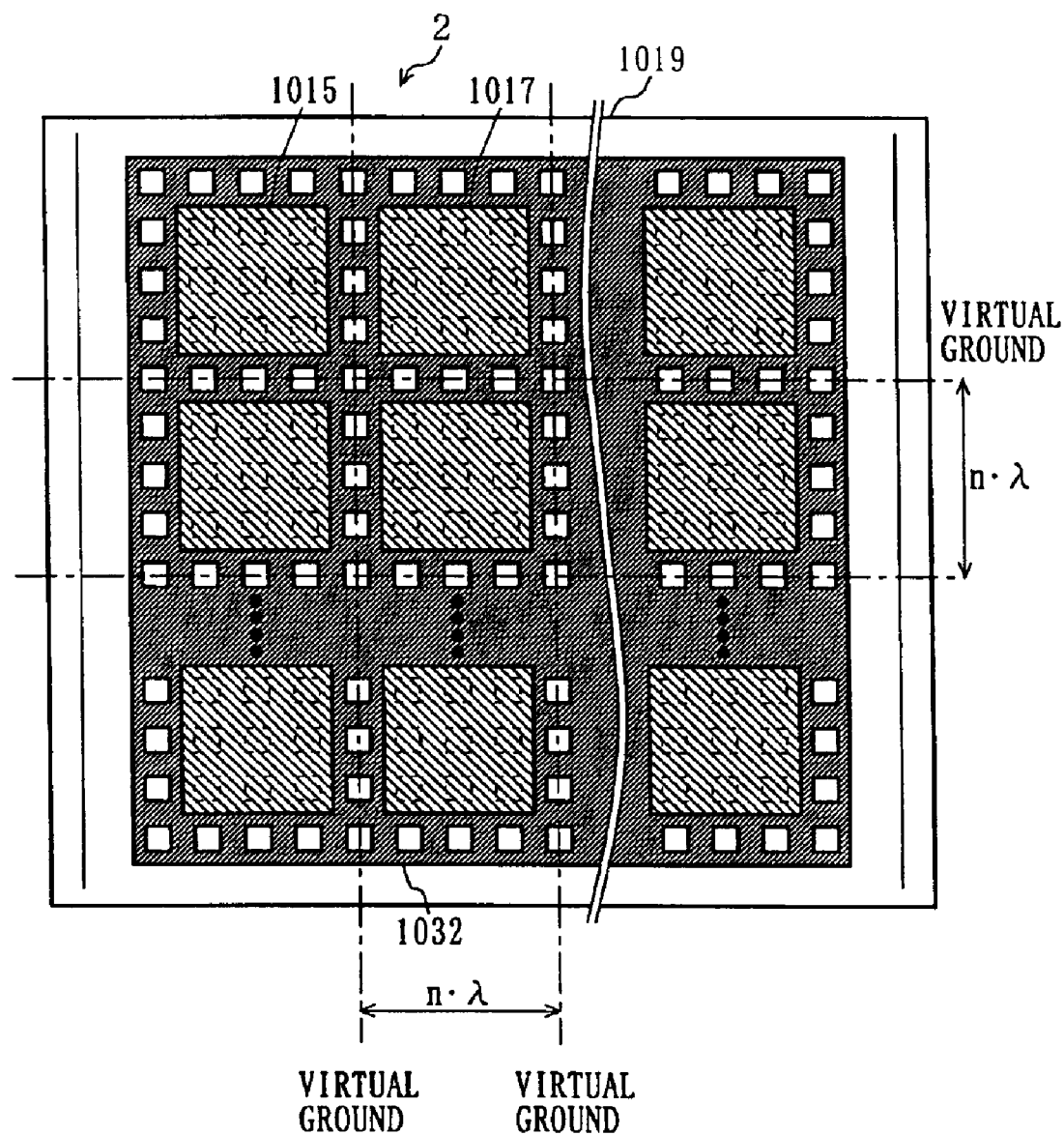
FIG. 9 is a schematic diagram illustrating a variant of the differential capacitor 2 shown in FIGS. 8A and 8B.

Although the above description illustrates an example where the differential capacitor 2 includes two capacitors (along the x-axis direction) by two capacitors (along the y-axis direction), the present invention is not limited thereto. Alternatively, as shown in FIG. 9 (where capacitors are indicated by hatching lines descending toward the right), the differential capacitor 2 may include three or more capacitors (along the x-axis direction) by three or more capacitors (along the y-axis direction), according to the principle described above. In this case, it is preferable that the distance between any two adjoining virtual grounds along the x axis or the y axis is equal to n·λ.

(Third Embodiment)

Figure 10A:
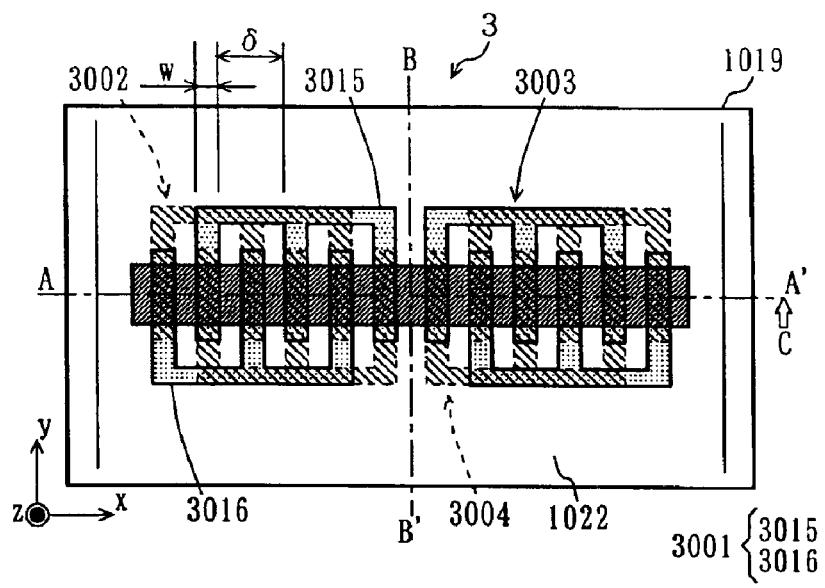
FIG. 10A is a schematic diagram illustrating a differential capacitor 3 according to a third embodiment of the present invention as viewed from vertically above.
Figure 10B:
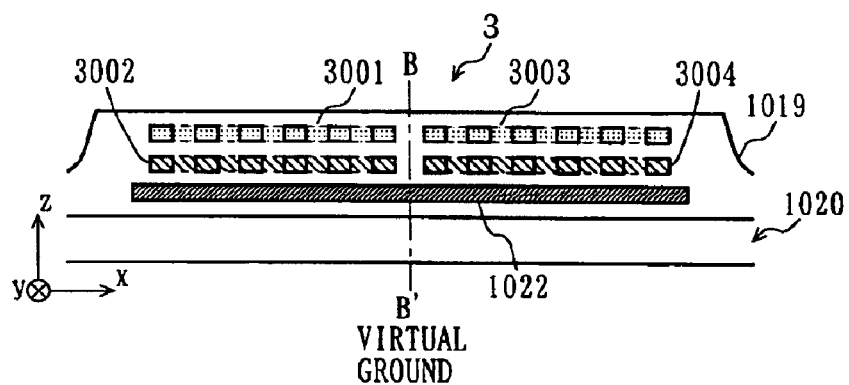
FIG. 10B is a schematic diagram showing a cross section of the differential capacitor 3 taken at a vertical plane A–A' in FIG. 10A, as viewed in the direction of arrow C.

FIG. 10A is a schematic diagram illustrating a differential capacitor 3 according to a third embodiment of the present invention as viewed from vertically above. FIG. 10B is a schematic diagram showing a cross section of the differential capacitor 3 taken at a vertical plane A–A' in FIG. 10A, as viewed in the direction of arrow C. In order to facilitate explanation, FIGS. 10A and 10B also show a three-dimensional coordinate system having three orthogonal axes of x, y, and z, where the z axis corresponds to the vertically upward direction, and the x and y axes correspond to the two respectively perpendicular directions on the horizontal plane. Note that the y axis is in the same direction as that of arrow C, and extends in parallel to a vertical plane B–B' described later.

In FIGS. 10A and 10B, the differential capacitor 3 includes first to fourth capacitors 3001 to 3004 and a shield plate 3005. The first to fourth capacitors 3001 to 3004 are formed in the interlayer film 1019 on the semiconductor substrate 1020. The semiconductor substrate 1020 and the interlayer film 1019 are identical to those described above in the "Description of the Background Art" section.

The first to fourth capacitors 3001 to 3004 are composed of metal wires which are typically aluminum.

The first capacitor 3001 includes a first electrode 3015 and a second electrode 3016. The first electrode 3015 is a comb-shaped electrode having a predetermined width w, including combtooth portions which are disposed with a pitch of δ. The first electrode 3015 is formed in a position which is away from the vertical plane B–B' (which is parallel to the YZ plane) by a predetermined distance in the minus direction of the x axis. For the sake of explanation, it is conveniently assumed that the combtooth portions of the first electrode 3015 are oriented so as to intersect the vertical plane A–A'. The second electrode 3016 has substantially the same shape as that of the first electrode 3015, although the second electrode 3016 is formed in a different position from the first electrode 3015. Specifically, the second electrode 3016 is formed in a position which is translated by a distance d (where d≈(δ−w)/2), in the plus direction or the minus direction of the x axis, from a position which is symmetrical from the first electrode 3015 with respect to the vertical plane A–A'. As a result, the first electrode 3015 and the second electrode 3016 appear as "engaging each other" when viewed from vertically above. Consequently, fringe capacitances can occur between adjacent combtooth portions of the first electrode 3015 and the second electrode 3016.

The second capacitor 3002 similarly includes a first electrode 3015 and a second electrode 3016. The second capacitor 3002 is formed in a position which is translated by a predetermined distance, in the minus direction of the z axis, from a position which is substantially symmetrical from the first electrode 3015 with respect to the vertical plane A–A'. As a result, as in the first capacitor 3001, fringe capacitances occur between adjacent combtooth portions along the x-axis direction. In addition, fringe capacitances can also occur between adjacent combtooth portions, along the z-axis direction, of the first capacitor 3001 and the second capacitor 3002.

The third capacitor 3003 is formed in a position which is substantially symmetrical from the first capacitor 3001 with respect to the vertical plane B–B'. The fourth capacitor 3004 is formed in a position which is substantially symmetrical from the second capacitor 3002 with respect to the vertical plane B–B'. Thus, fringe capacitances can also occur in the third and fourth capacitors 3003 and 3004, as described above.

Figure 11:
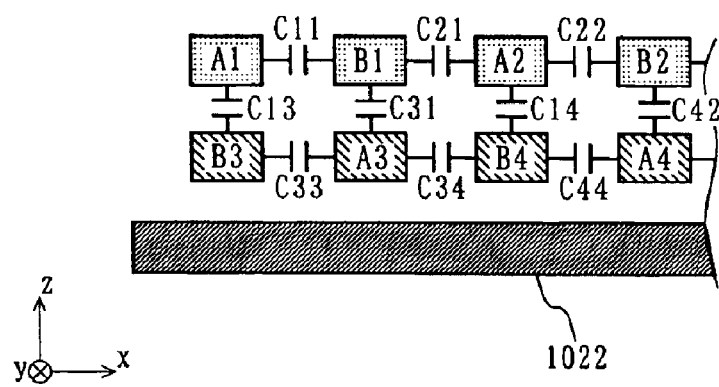
FIG. 11 is a schematic diagram showing an equivalent circuit of the differential capacitor 3 shown in FIGS. 10A and 10B.

FIG. 11 is a schematic diagram showing an equivalent circuit of the differential capacitor 3 shown in FIGS. 10A and 10B. In FIG. 11, as one example, it is assumed that a combtooth portion A1 is the leftmost combtooth portion of the second electrode 3016 of the first capacitor 3001. Under this assumption, a combtooth portion A2 is a combtooth portion of the second electrode 3016 of the first capacitor 3001 that lies adjacent to the combtooth portion A1. A combtooth portion B1 is the leftmost combtooth portion of the first electrode 3015 of the first capacitor 3001. A combtooth portion B2 is a combtooth portion of the first electrode 3015 of the first capacitor 3001 that lies adjacent to the combtooth portion B1.

A combtooth portion B3 is a combtooth portion of the second capacitor 3002 that opposes the combtooth portion A1 along the z-axis direction. A combtooth portion B4 is a combtooth portion of the second capacitor 3002 that opposes the combtooth portion A2 along the z-axis direction.

A combtooth portion A3 is a combtooth portion of the second capacitor 3002 that opposes the combtooth portion B1 along the z-axis direction. A combtooth portion A4 is a combtooth portion of the second capacitor 3002 that opposes the combtooth portion B2 along the z-axis direction.

When an in-phase signal or a reverse-phase signal of a differential pair of signals is supplied to the first and second capacitors 3001 and 3002 having the above structures, the combtooth portion A1 will have a fringe capacitance C11 between itself and a side face of the combtooth portion B1. The combtooth portions A1 and B3 will have a capacitance C13, between the lower face of the combtooth portion A1 and the upper face of the combtooth portion B3. Similarly, fringe capacitances C21, C22, C33, C34, and C44 as shown in FIG. 11 also will occur with respect to the other combtooth portions, and capacitance C31, C14, and C42 will occur. Therefore, a total capacitance value Ctotal occurring among the combtooth portions A1 to A4 and B1 to B4 can be expressed by equation (2) below:

$$Ctotal=C11+C13+C33+C31+C21+C24+C34+C22+C42+C44 \quad (2)$$

The shield plate 3005 is a plate-like component composed of a conductive material such as aluminum, which has a symmetrical shape with respect to the vertical plane B–B' along the horizontal direction. The shield plate 3005 is interposed between the semiconductor substrate 1020 and both the second capacitor 3002 and the fourth capacitor 3004. The shield plate 3005 has a shape such that, when the second capacitor 3002 and the fourth capacitor 3004 are projected onto the shield plate 3005 from vertically above, the projected second capacitor 3002 and fourth capacitor 3004 appear as partially overlapping with the shield plate 3005. As in the previous embodiments, a portion of each of the second capacitor 3002 and the fourth capacitor 3004 whose projected image overlaps with the shield plate 3005 will be referred to as an "overlapping region Ao".

Figure 12:
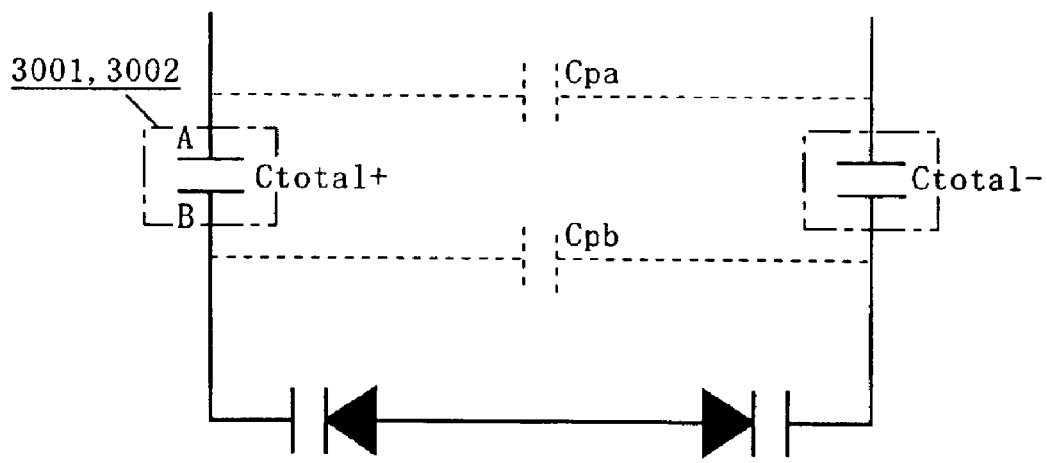
FIG. 12 is a schematic diagram illustrating parasitic capacitances Cpa and Cpb which may occur in the differential capacitor 3 shown in FIGS. 10A and 10B.

In the differential capacitor 3 having the above structure, by providing the shield plate 3005 vertically under the second and fourth capacitors 3002 and 3004, the parasitic capacitances Cpa and Cpb (shown as dot-line images) as shown in FIG. 12 occur between the upper face of the shield plate 3005 and the lower faces of the combtooth portions A3, A4, B3, and B4. When the differential capacitor 3 is incorporated in the differential oscillation circuit 7, for example, such parasitic capacitances Cpa and Cpb will affect the oscillation frequency range thereof. On the other hand, if the shield layer 3005 were omitted, for the same reason as that described in the first embodiment, the differential capacitor 3 and the semiconductor substrate 1020 are coupled together via large parasitic capacitances occurring on both sides of the differential capacitor 3, so that the influence of the parasitic resistances occurring in the semiconductor substrate 1020 becomes outstanding. As a result, the quality factor of the differential capacitor 3 would be deteriorated, thereby affecting the C/N (Carrier to Noise ratio) of the differential oscillation circuit. However, the overlap ratio may also be optimized in the present embodiment as described in the previous embodiments, thereby minimizing the deterioration in the oscillation frequency range of the differential oscillation circuit 7 and minimizing C/N deterioration in the differential oscillation circuit 7. In the present embodiment, the overlap ratio is defined as (So/S)× 100[%], where S is the total area of the lower faces of the second capacitor 3002 and the fourth capacitor 3004, and So is the total area of the overlapping regions Ao in the second capacitor 3002 and the fourth capacitor 3004.

(Fourth Embodiment)

Figure 13:
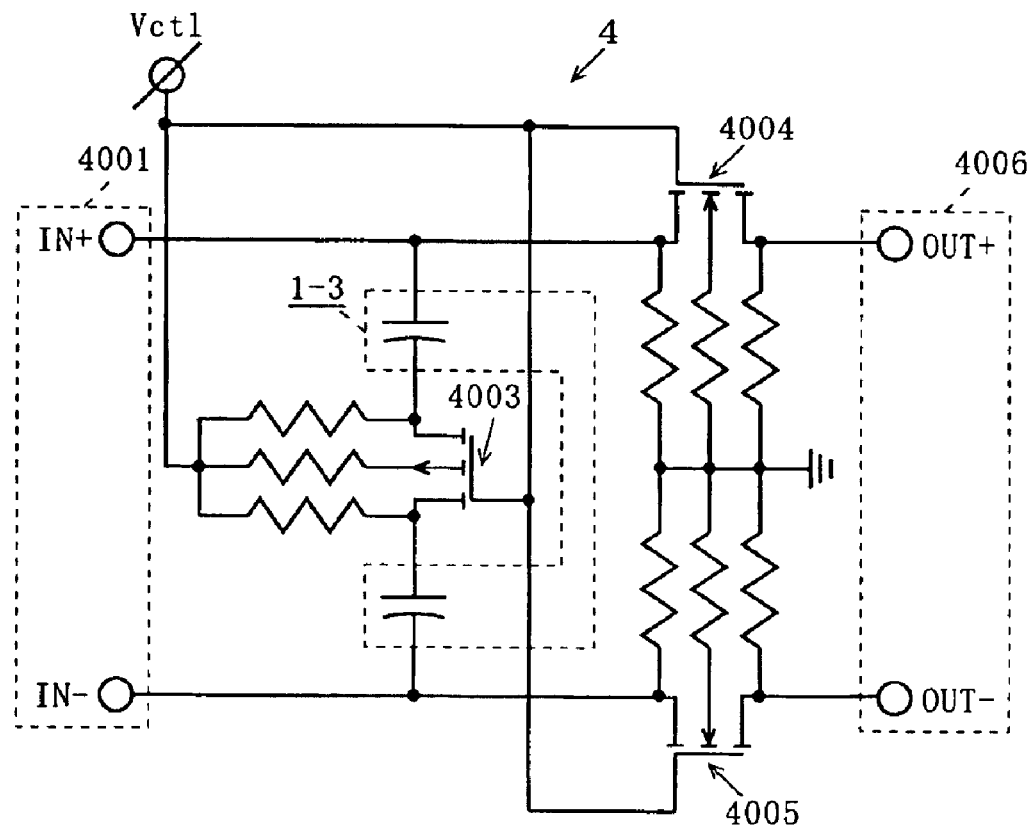
FIG. 13 is a schematic diagram illustrating the structure of a differential switching circuit 4 according to a fourth embodiment of the present invention.

FIG. 13 is a schematic diagram illustrating the structure of a differential switching circuit 4 according to a fourth embodiment of the present invention. In FIG. 13, the differential switching circuit 4 comprises: differential input terminals 4001, an input terminal 4002 for receiving a control signal; a p-channel MOSFET 4003; n-channel MOSFETs 4004 and 4005; any one of the differential capacitors 1 to 3 described in the previous embodiments; and differential output terminals 4006.

The differential input terminals 4001 include a terminal IN+ and a terminal IN– for respectively receiving an in-phase signal and a reverse-phase signal composing a differential pair of signals.

To the input terminal 4002, a binary signal (hereinafter referred to as a "control signal") Vct1 for switching the MOSFETs 4003 to 4005 on or off is input.

The MOSFET 4003 is connected to the input terminal 4002, and is turned on when the control signal Vct1 is at a high (Hi) level. On the other hand, the MOSFET 4003 is turned off when the control signal Vct1 is at a low (Lo) level.

The MOSFETs 4004 and 4005 are connected to the input terminal 4002, and are turned off when the control signal Vct1 is "Hi". On the other hand, the MOSFETs 4004 and 4005 are turned on when the control signal Vct1 is "Lo".

The differential output terminals 4006 include a terminal OUT+ and a terminal OUT– for respectively outputting an in-phase signal and a reverse-phase signal composing a differential pair of signals while the control signal Vct1 is "Hi".

In the differential switching circuit 4 having the above structure, an in-phase signal and a reverse-phase signal are input to the terminals IN+ and IN–, respectively. To the input terminal 4002, the control signal Vct1 having a "Hi" or "Lo" value is input.

While the control signal Vct1 is "Hi", the n-channel MOSFETs 4004 and 4005 are turned on and the p-channel MOSFET 4003 is turned off. Therefore, an in-phase signal and a reverse-phase signal are output from the terminals OUT+ and OUT–, respectively.

On the other hand, while the control signal Vct1 is "Lo", the n-channel MOSFETs 4004 and 4005 are turned off and the p-channel MOSFET 4003 is turned on, so that the terminals OUT+ and OUT– are substantially completely isolated from the differential switching circuit 4. As a result, the terminals OUT+ and OUT– do not output an in-phase signal and a reverse-phase signal.

In the differential capacitor 1, 2, or 3, the overlapping area between each projected lower electrode and each shield plate is to be defined based on the isolation while the MOSFET 4003 circuit (functioning as a switch) is off and the quality factor of each capacitor.

A bias is applied to a drain and a source of the MOSFET 4003 while the control signal Vct1 is "Hi". However, DC components to the n-channel MOSFETs 4004 and 4005 can be cut off by means of the differential capacitor 1, 2, or 3.

In order to clarify the technical effects provided by the present embodiment, the problems which may arise in the case where a conventional differential capacitor is incorporated in a switching circuit, instead of any one of the differential capacitors 1 to 3, will be described. If a differential capacitor which lacks a shield plate is incorporated in a switching circuit, the insertion loss due to the insertion of the switching circuit is increased while the switching circuit is on, due to the influence of the parasitic resistances occurring in the semiconductor substrate, thus resulting in a decrease in the intensity of the output differential pair of signals. In the case where a differential capacitor whose overlap ratio as defined above is 100% is incorporated, the parasitic capacitance occurring between each capacitor and the shield plate will prevent the p-channel MOSFET 4003 from being completely turned off, so that the differential pair of signals which are input to the differential input terminals 4001 will leak via the parasitic capacitances. As a result, while the n-channel MOSFETs 4004 and 4005 is on, the switching circuit will have an increased insertion loss, so that the intensity of the output differential pair of signals is deteriorated. In contrast, if any one of the above-described differential capacitors 1 to 3 is employed, the parasitic capacitances are minimized, so that a switching circuit 4 having little insertion loss can be realized.

(Fifth Embodiment)

Figure 14A:
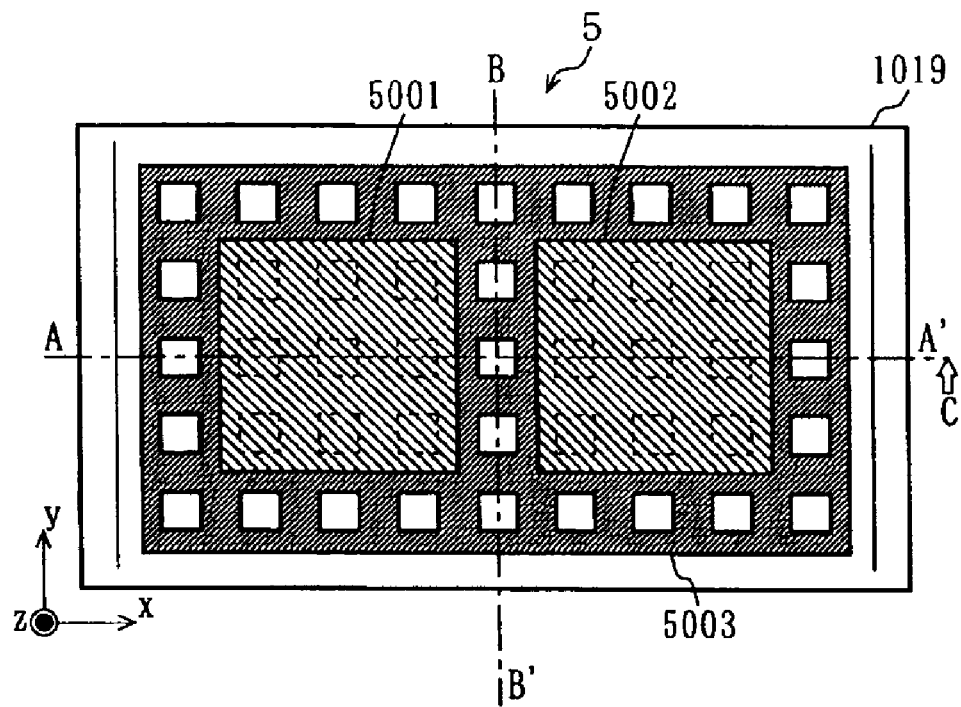
FIG. 14A is a schematic diagram illustrating a differential antenna element 5 according to a fifth embodiment of the present invention as viewed from vertically above.
Figure 14B:
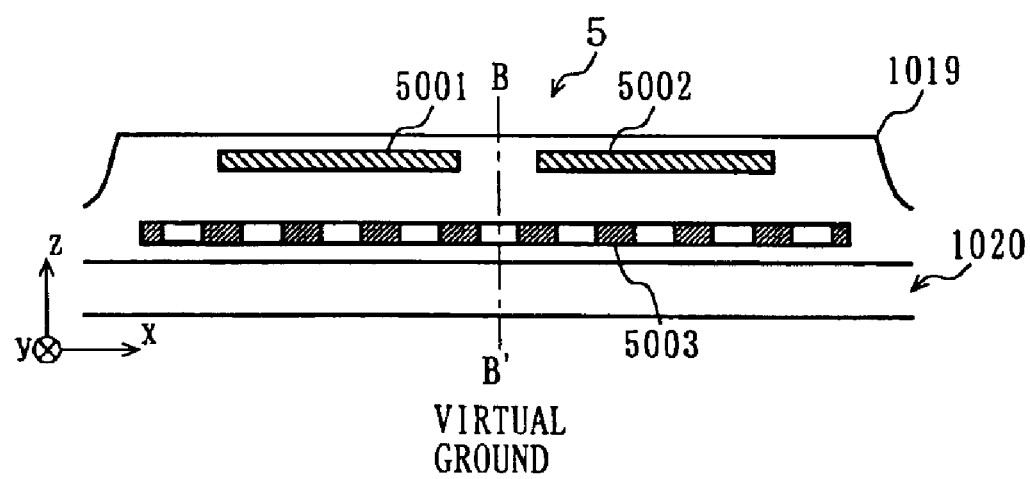
FIG. 14B is a schematic diagram showing a cross section of the differential capacitor 5 taken at a vertical plane A–A' in FIG. 14A, as viewed in the direction of arrow C.

FIG. 14A is a schematic diagram illustrating a differential antenna element 5 according to a fifth embodiment of the present invention as viewed from vertically above. FIG. 14B is a schematic diagram showing a cross section of the differential capacitor 5 taken at a vertical plane A–A' in FIG. 14A, as viewed in the direction of arrow C. In order to facilitate explanation, FIGS. 14A and 14B also show a three-dimensional coordinate system having three orthogonal axes of x, y, and z, where the z axis corresponds to the vertically upward direction, and the x and y axes correspond to the two respectively perpendicular directions on the horizontal plane. Note that the y axis is in the same direction as that of arrow C, and extends in parallel to a vertical plane B–B' described later.

In FIGS. 14A and 14B, the differential antenna element 5 comprises a first planar antenna element 5001, a second planar antenna element 5002, and a shield plate 5003.

The first and second planar antenna elements 5001 and 5002 are formed in the interlayer film 1019 on the semiconductor substrate 1020. The semiconductor substrate 1020 and the interlayer film 1019 are identical to those described above in the "Description of the Background Art" section. The first and second planar antenna elements 5001 and 5002 is typically composed of plate-like pieces of dielectric material.

The first planar antenna element 5001 is disposed away from the semiconductor substrate 1020 by a predetermined distance in the plus direction (vertically upward) of the z axis, and is formed in a position which is away from the vertical plane B–B' by a predetermined distance in the minus direction of the x axis.

The second planar antenna element 5002 has substantially the same shape as that of the first planar antenna element 5001, and is formed in a substantially symmetrical position from the first planar antenna element 5001 with respect to the vertical plane B–B'.

The shield plate 5003 is substantially the same as the shield plate 1024 shown in FIGS. 6A and 6B. The shield plate 5003 is interposed between the semiconductor substrate 1020 and both the first and second planar antenna elements 5001 and 5002.

In a differential antenna element which lacks a shield plate, the gain of the differential antenna element is decreased by a loss associated with the parasitic resistances occurring in the semiconductor substrate. Moreover, in a conventional differential antenna element, the frequency bandwidth in which each planar antenna element is capable of transmission/reception is narrowed due to the parasitic capacitances occurring between the shield plate and the planar antenna elements. In contrast, by employing the shield plate 5003 according to the present embodiment, whose overlap ratio is optimized as described in the previous embodiments, it is possible to minimize the deterioration in the frequency bandwidth in which the first and second planar antenna elements 5001 and 5002 are capable of transmission/reception, while preventing a decrease in the gains of the first and second planar antenna elements 5001 and 5002.

Although the present embodiment illustrates an exemplary case where the shield plate 5003 has the same structure as that shown in FIGS. 6A and 6B, the present invention is not limited thereto. It will be appreciated that a shield plate described in any of the previous embodiments, or an equivalent thereof, may instead be employed.

(Sixth Embodiment)

Figure 15:
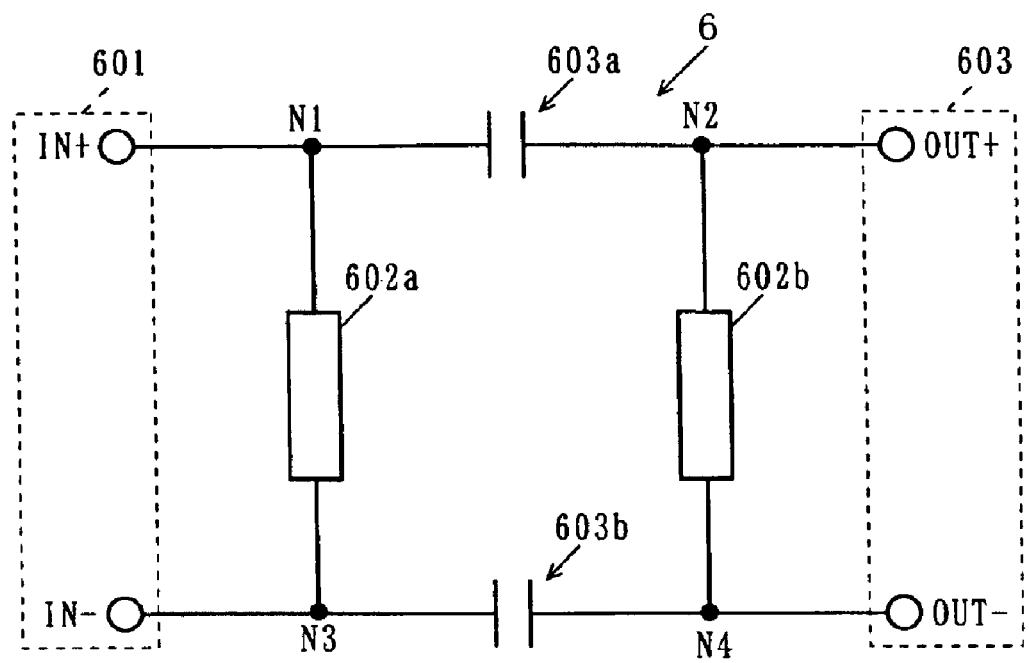
FIG. 15 is a schematic diagram illustrating an overall circuit structure of a filter circuit 6 according to a sixth embodiment of the present invention.

FIG. 15 is a schematic diagram illustrating an overall circuit structure of a filter circuit 6 according to a sixth embodiment of the present invention. In FIG. 15, the filter circuit 6 comprises differential input terminals 601, two ½ wavelength resonators 602a and 602b, two capacitors 603a and 603b, and differential output terminals 604.

The differential input terminals 601 include a terminal IN+ and a terminal IN– for respectively receiving an in-phase signal and a reverse-phase signal composing a differential pair of signals.

Figure 16A:
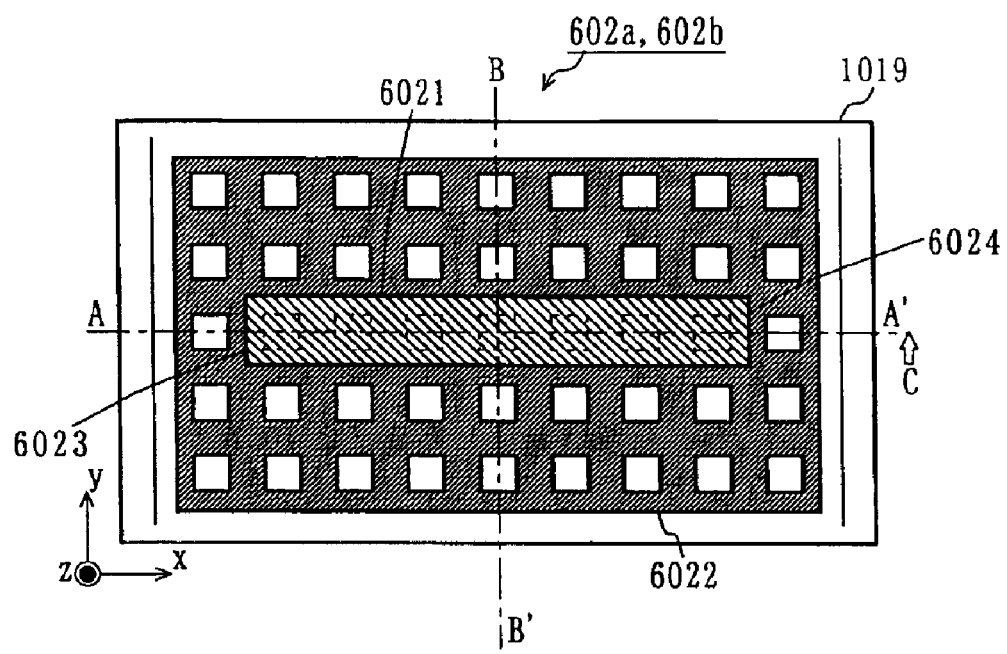
FIG. 16A is a schematic diagram showing the ½ wavelength resonators 602a and 602b in FIG. 15 as viewed from vertically above.
Figure 16B:
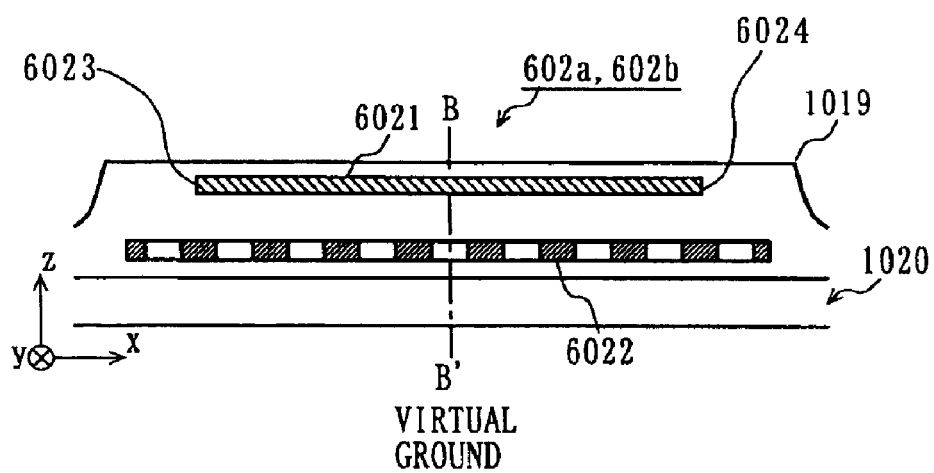
FIG. 16B is a schematic diagram showing a cross section of the ½ wavelength resonators 602a and 602b taken at a vertical plane A–A' in FIG. 16A, as viewed in the direction of arrow C.

Both ½ wavelength resonators 602a and 602b are in parallel connection with respect to the terminals IN+ and IN–. FIG. 16A is a schematic diagram showing the ½ wavelength resonators 602a and 602b in FIG. 15 as viewed from vertically above. FIG. 16B is a schematic diagram showing a cross section of the ½ wavelength resonators 602a and 602b taken at a vertical plane A–A' in FIG. 16A, as viewed in the direction of arrow C. In order to facilitate explanation, FIGS. 16A and 16B also show a three-dimensional coordinate system having three orthogonal axes of x, y, and z, where the z axis corresponds to the vertically upward direction, and the x and y axes correspond to the two respectively perpendicular directions on the horizontal plane. Note that the y axis is in the same direction as that of arrow C, and extends in parallel to a vertical plane B–B' described later. Since the ½ wavelength resonators 602a and 602b have the same structure, only the ½ wavelength resonator 602a will be described below.

In FIGS. 16A and 16B, the ½ wavelength resonator 602a comprises a belt-like planar plate 6021 and a shield plate 6022. The planar plate 6021 is formed in an interlayer film 1019 on the semiconductor substrate 1020. The semiconductor substrate 1020 and the interlayer film 1019 are identical to those described above in the "Description of the Background Art" section. The planar plate 6021, which is composed of a material having dielectric properties, is formed in a position which is away from the semiconductor substrate 1020 by a predetermined distance in the plus direction of the z axis (along the vertical direction), and has a symmetrical shape with respect to the vertical plane B–B'.

The planar plate 6021 has a first terminal 6023 and a second terminal 6024, which are formed at symmetrical positions from each other with respect to the vertical plane B–B'. The first terminal 6023 and the second terminal 6024 of the planar plate 6021 are connected to the terminal IN+ and to the terminal IN–, respectively.

The capacitor 603*a* is connected between a node N1 and a node N2, where the node N1 is a point at which the terminal IN+ is connected to the ½ wavelength resonator 602*a*, and the node N2 is a point at which the terminal OUT+ is connected to the ½ wavelength resonator 602*b*.

The capacitor 603*b* is connected between a node N3 and a node N4, where the node N3 is a point at which the terminal IN– is connected to the ½ wavelength resonator 602*a*, and the node N4 is a point at which the terminal OUT– is connected to the ½ wavelength resonator 602*b*.

The shield plate 6022 is a plate-like component composed of a conductive material such as aluminum, which has a symmetrical shape with respect to the vertical plane B–B' along the horizontal direction. The shield plate 6022 is interposed between the planar plate 6021 and the semiconductor substrate 1020. The shield plate 6022 has a shape such that, when the planar plate 6021 is projected onto the shield plate 6022 from vertically above, the projected planar plate 6021 appears as partially overlapping with the shield plate 6022. In the present embodiment, the shield plate 6022 has through-holes similar to the through-holes 10241 shown in FIGS. 6A and 6B.

Referring back to FIG. 15, the differential output terminals 604 includes a terminal OUT+ and a terminal OUT– for respectively outputting an in-phase signal and a reverse-phase signal composing a differential pair of signals.

In the filter circuit 6 having the above structure, when a differential pair of signals having a desired frequency are input to the differential input terminals 601, the impedance of the ½ wavelength resonators 602*a* and 602*b* becomes very high, as a result of which the differential pair of signals are output from the differential output terminals 604.

On the other hand, if a differential pair of signals having a frequency other than the desired frequency are input to the differential input terminals 601, the impedance of the ½ wavelength resonators 602*a* and 602*b* becomes very small, as a result of which the outputting at the differential output terminals 604 is suppressed.

If a ½ wavelength resonator which lacks a shield plate is applied to a filter circuit, the insertion loss of the filter circuit is increased due to a loss associated with the parasitic resistances occurring in the semiconductor substrate. In the case where a ½ wavelength resonator whose overlap ratio as defined above is 100% is applied to a filter circuit, the parasitic capacitances occurring between the shield plate and the planar plate will reduce the passing frequency bandwidth of the filter circuit. In contrast, by employing the shield plate 6022 according to the present embodiment, whose overlap ratio is optimized as described in the previous embodiments, it is possible to minimize the insertion loss of the filter circuit 6, while preventing deterioration in the passing frequency bandwidth thereof.

Although the present embodiment illustrates an exemplary case where the shield plate 6022 has the same structure as that shown in FIGS. 6A and 6B, the present invention is not limited thereto. It will be appreciated that a shield plate described in any of the previous embodiments, or an equivalent thereof, may instead be employed.

While the invention has been described in detail, the foregoing description is in all aspects illustrative and not restrictive. It is understood that numerous other modifications and variations can be devised without departing from the scope of the invention.

What is claimed is:

1. A differential capacitor comprising a plurality of capacitors, each having an upper electrode and a lower electrode which are substantially parallel to each other along a vertical direction, wherein, any one of the plurality of capacitors is formed on a semiconductor substrate in a substantially symmetrical position from another of the plurality of capacitors with respect to a vertical plane, the differential capacitor further comprises a shield plate interposed between each lower electrode and the semiconductor substrate, and when each lower electrode is projected onto the shield plate along the vertical direction, each projected lower electrode has a partial overlap with the shield plate.

2. The differential capacitor according to claim 1, wherein the partial overlap of each projected lower electrode with the shield plate accounts for 70% or more of an area of the lower electrode.

3. The differential capacitor according to claim 2, wherein each projected lower electrode extends outside of the shield plate.

4. The differential capacitor according to claim 2, wherein the shield plate has a slit formed therein.

5. The differential capacitor according to claim 4, wherein the slit intersects the vertical plane.

6. The differential capacitor according to claim 2, wherein the shield plate has a plurality of through-holes formed therein.

7. The differential capacitor according to claim 6, wherein, the plurality of through-holes are disposed along two predetermined directions at a substantially equal interval, and the interval between adjoining ones of the plurality of through-holes is substantially equal to an integer multiple of ½ a wavelength of standing waves which propagate through the shield plate.

8. The differential capacitor according to claim 7, wherein a length from two predetermined sides of the shield plate to the vertical plane is substantially equal to a sum of an integer multiple of ½ the wavelength of the standing waves and ¼ the wavelength of the standing waves.

9. The differential capacitor according to claim 1, wherein, among the plurality of capacitors, any two capacitors adjoining each other respectively receive an in-phase signal and a reverse-phase signal composing a differential pair of signals.

10. The differential capacitor according to claim 1, wherein the shield plate is connected to ground via an inductance and/or a resistor.

11. The differential capacitor according to claim 1, wherein a portion of the shield plate that intersects the vertical plane is connected to ground.

12. The differential capacitor according to claim 1 as used for a variable capacitance circuit in which at least one variable capacitor is connected to each lower electrode or at least one variable capacitor is connected to each upper electrode.

13. The differential capacitor according to claim 12, wherein the area of the partial overlap of each projected lower electrode with the shield plate is determined based on a capacitance variation ratio of the variable capacitance circuit and a quality factor of each capacitor.

14. The differential capacitor according to claim 1 as used in a differential oscillation circuit.

15. The differential capacitor according to claim 1 as used in a switching circuit in which at least one switch element is connected to each of the first lower electrode and the second lower electrode.

16. The differential capacitor according to claim 15, wherein the area of the partial overlap of each projected lower electrode with the shield plate is determined based on an isolation when the switching circuit is off and a quality factor of each capacitor.

17. The differential capacitor according to claim 1 as used in a differential switching circuit.

18. The differential capacitor according to claim 1, wherein,
- a first one of the plurality of capacitors is formed on the semiconductor substrate in a substantially symmetrical position from one of the plurality of capacitors with respect to the vertical plane,
- a second one of the plurality of capacitors is formed on the semiconductor substrate in a substantially symmetrical position from the one capacitor with respect to a further vertical plane which lies perpendicular to the vertical plane, and
- a third one of the plurality of capacitors is formed on the semiconductor substrate in a substantially symmetrical position from the one capacitor with respect to a line of intersection between the vertical plane and the further vertical plane.

19. The differential capacitor according to claim 18, wherein an in-phase signal and a reverse-phase signal composing a differential pair of signals are supplied to the plurality of capacitors in such a manner that one of the in-phase signal or the reverse-phase signal is supplied to both the one capacitor and the third capacitor and that the other of the in-phase signal or the reverse-phase signal is supplied to both the first and second capacitors.

20. The differential capacitor according to claim 18, wherein,
- the shield plate has a plurality of through-holes formed therein, the through-holes being disposed along two predetermined directions at a substantially equal interval, such that the interval between adjoining ones of the plurality of through-holes is substantially equal to an integer multiple of ½ a wavelength of standing waves which propagate through the shield plate, and
- the shield plate has a substantially rectangular shape such that a length from two predetermined sides of the shield plate to the vertical plane and a length from the other two sides of the shield plate to the further vertical plane are each substantially equal to a sum of an integer multiple of ½ the wavelength of the standing waves and ¼ the wavelength of the standing waves.

21. A differential antenna element comprising:
- a plurality of antenna elements which are formed on a semiconductor substrate in substantially symmetrical positions from each other with respect to a vertical plane; and
- a shield plate interposed between each antenna element and the semiconductor substrate,
- wherein, when each antenna element is projected onto the shield plate along the vertical direction, each projected antenna element has a partial overlap with the shield plate.

22. The differential antenna element according to claim 21, wherein each projected antenna element extends outside of the shield plate.

23. The differential antenna element according to claim 21, wherein the shield plate has a slit formed therein.

24. The differential antenna element according to claim 23, wherein the slit intersects the vertical plane.

25. The differential antenna element according to claim 21, wherein the shield plate has a plurality of through-holes formed therein.

26. The differential antenna element according to claim 21, wherein, among the plurality of antenna elements, any two antenna elements adjoining each other respectively receive an in-phase signal and a reverse-phase signal composing a differential pair of signals.

27. The differential antenna element according to claim 21, wherein the shield plate is connected to ground via an inductance and/or a resistor.

28. The differential antenna element according to claim 21, wherein a portion of the shield plate that intersects the vertical plane is connected to ground.

29. A differential resonator formed on a semiconductor substrate, comprising:
- at least one dielectric planar plate having a substantially symmetrical shape with respect to a vertical plane and having two terminals which are in substantially symmetrical positions from each other with respect to the vertical plane; and
- a shield plate which is disposed between the at least one planar plate and the semiconductor substrate,
- wherein, when the at least one planar plate is projected onto the shield plate along the vertical direction, the at least one projected planar plate has a partial overlap with the shield plate.

30. The differential resonator according to claim 29, wherein the at least one projected planar plate extends outside of the shield plate.

31. The differential resonator according to claim 29, wherein the shield plate has a slit formed therein.

32. The differential resonator according to claim 31, wherein the slit intersects the vertical plane.

33. The differential resonator according to claim 29, wherein the shield plate has a plurality of through-holes formed therein.

34. The differential resonator according to claim 29, wherein, an in-phase signal and a reverse-phase signal composing a differential pair of signals are respectively applied to the two terminals of the at least one planar plate.

35. The differential resonator according to claim 29, wherein the shield plate is connected to ground via an inductance and/or a resistor.

36. The differential resonator according to claim 29, wherein a portion of the shield plate that intersects the vertical plane is connected to ground.

37. The differential resonator according to claim 29 as used in a filter circuit.

* * * * *